United States Patent
Lim et al.

(10) Patent No.: US 11,534,795 B2
(45) Date of Patent: Dec. 27, 2022

(54) PREPARING METHOD OF MONOMOLECULAR NANO-THIN FILM

(71) Applicant: Research & Business Foundation Sungkyunkwan University, Suwon-si (KR)

(72) Inventors: Byungkwon Lim, Seoul (KR); Shingyu Bok, Suwon-si (KR)

(73) Assignee: Research & Business Foundation Sungkyunkwan University, Suwon-si (KR)

( * ) Notice: Subject to any disclaimer, the term of this patent is extended or adjusted under 35 U.S.C. 154(b) by 425 days.

(21) Appl. No.: 16/656,734

(22) Filed: Oct. 18, 2019

(65) Prior Publication Data
US 2020/0122190 A1    Apr. 23, 2020

(30) Foreign Application Priority Data
Oct. 23, 2018   (KR) .................. 10-2018-0126765
Oct. 4, 2019    (KR) .................. 10-2019-0122930

(51) Int. Cl.
*B05D 3/02*     (2006.01)
*B05D 3/10*     (2006.01)
(Continued)

(52) U.S. Cl.
CPC ............. *B05D 3/02* (2013.01); *B05D 3/10* (2013.01); *B05D 7/52* (2013.01);
(Continued)

(58) Field of Classification Search
CPC ... B05D 3/02; B05D 3/10; B05D 7/52; B05D 2201/02; B05D 2202/25; B05D 2202/45;
(Continued)

(56) References Cited

U.S. PATENT DOCUMENTS 4,469,696 A * 9/1984 Rosentreter ............... A61P 3/06
                                                 514/253.01
4,832,729 A * 5/1989 Shigematsu ........... A01N 43/66
                                                 504/242
(Continued)

FOREIGN PATENT DOCUMENTS

CN    103774124    *  5/2014
EP    0780377      * 10/1996
(Continued)

OTHER PUBLICATIONS

Korean Office Action dated Mar. 27, 2020 in counterpart Korean Patent Application No. 10-2018-0126765 (5 pages in Korean).

*Primary Examiner* — Brian K Talbot
(74) *Attorney, Agent, or Firm* — NSIP Law

(57) ABSTRACT

The present disclosure relates to a method of preparing a monomolecular nano-thin film, including: coating, on a substrate, a dispersion solution containing a compound represented by the following Chemical Formula 1; and performing annealing to the coated substrate:

[Chemical Formula 1]

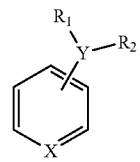

in the above Chemical Formula 1,
X and Y are each independently nitrogen, carbon, sulfur, or oxygen, (Continued)

COAT DISPERSION SOLUTION CONTAINING COMPOUND ON SUBSTRATE — S100

PERFORM ANNEALING TO COATED SUBSTRATE — S200

$R_1$ and $R_2$ are each independently hydrogen, oxygen, a hydroxy group (—OH), or a linear or branched $C_1$ to $C_{10}$ alkyl group.

12 Claims, 24 Drawing Sheets
(20 of 24 Drawing Sheet(s) Filed in Color)

(51) Int. Cl.
    *B05D 7/00*      (2006.01)
    *H01L 21/02*      (2006.01)
    *B82Y 30/00*      (2011.01)

(52) U.S. Cl.
    CPC .. *H01L 21/02282* (2013.01); *H01L 21/02296* (2013.01); *B05D 2201/02* (2013.01); *B05D 2202/10* (2013.01); *B05D 2202/25* (2013.01); *B05D 2202/45* (2013.01); *B05D 2203/35* (2013.01); *B05D 2350/35* (2013.01); *B05D 2401/10* (2013.01); *B82Y 30/00* (2013.01)

(58) Field of Classification Search
    CPC ............ B05D 2203/35; B05D 2350/35; B05D 2401/10; B82Y 30/00; H01L 21/02282; H01L 21/02296
    USPC .......................................................... 427/58
    See application file for complete search history.

(56) References Cited

U.S. PATENT DOCUMENTS

| | | | |
|---|---|---|---|
| 5,518,588 A * | 5/1996 | Fechtel | C07D 213/73 205/426 |
| 2012/0145554 A1* | 6/2012 | Liu | C23C 18/1879 205/187 |
| 2014/0171296 A1* | 6/2014 | Hirsekorn | C23C 18/2086 502/167 |
| 2014/0260700 A1* | 9/2014 | Thomas | G01N 33/483 73/864.91 |
| 2018/0272601 A1* | 9/2018 | Erickson | B33Y 10/00 |

FOREIGN PATENT DOCUMENTS

| | | |
|---|---|---|
| KR | 10-2006-0099472 A | 9/2006 |
| KR | 10-2015-0132919 A | 11/2015 |
| KR | 10-1756127 B1 | 7/2017 |

* cited by examiner

COMPARATIVE EXAMPLE 1     EXAMPLE 1

EXAMPLE 3

EXAMPLE 4

EXAMPLE 5

EXAMPLE 3

EXAMPLE 4

EXAMPLE 5

PREPARING METHOD OF MONOMOLECULAR NANO-THIN FILM

CROSS REFERENCE TO RELATED APPLICATIONS

This application claims the benefit under 35 USC § 119(a) of Korean Patent Application Nos. 1 0-201 8-01 26765 filed on Oct. 23, 2018, and 10-2019-0122930 filed on Oct. 4, 2019, in the Korean Intellectual Property Office, the entire disclosures of which are incorporated herein by reference for all purposes.

TECHNICAL FIELD

The present disclosure relates to a method of preparing a monomolecular nano-thin film.

BACKGROUND OF THE INVENTION

As human interface technology emphasizing durability, flexibility, and convenience continues to develop, the importance of development of flexible electronic devices and materials increases more and more. Flexible electrodes and materials required to drive the flexible electronic devices are also actively researched. Particularly, a demand for transparent electrodes and materials is continuously increasing in industrial fields such as touch-screen panel (TCP), solar cell, display, and the like. Thus, there is an urgent need to secure source technology to gain economic and technological superiority. Meanwhile, with the advancement of nanotechnology, nanomaterials which did not exist or could not be controlled have been synthesized. Among these nanomaterials, nanocrystals, carbon nanotubes, silicon nanowires, and metal nanowires have been applied to electronic devices. Particularly, the metal nanowires have high conductivity and are too small in size to be seen with naked eyes in the visible light region and thus are suitable for application to transparent electrodes.

Among all of the metals, particularly silver (Ag) has high electrical conductivity and thermal conductivity. Also, Ag has excellent optical characteristics such as high surface enhanced Raman efficiency in the visible light region. If a nanowire is made of Ag, it can be applied to various fields from micro electronic device to transparent electrode and is also expected to be applied to optical-, chemical- or biosensors.

However, a transparent electrode using the Ag nanowire with the above-described advantages have many problems to be solved. First, in terms of durability, oxidation of the Ag nanowire by the air and desorption of the Ag nanowire caused by weak binding force with respect to a substrate may permanently cause a decrease in electrical conductivity of the substrate. Second, despite of high electrical conductivity of Ag, a high contact resistance is generated at an intersection between the Ag nanowires when a network serving as a path for electrons is formed and thus causes a decrease in electrical conductivity of the entire substrate.

Korean Patent No. 10-1756127 discloses a transparent electrode including a metal nanowire and an organic light-emitting diode using the transparent electrode, but does not mention a compound that enhances binding force between a substrate and a metal nanowire.

DISCLOSURE OF THE INVENTION

Problems to be Solved by the Invention

In view of the foregoing, the present disclosure provides a method of preparing a monomolecular nano-thin film.

However, problems to be solved by the present disclosure are not limited to the above-described problems. There may be other problems to be solved by the present disclosure.

Means for Solving the Problems

According to a first aspect of the present disclosure, there is provided a method of preparing a monomolecular nano-thin film, including: coating, on a substrate, a dispersion solution containing a compound represented by the following Chemical Formula 1; and performing annealing to the coated substrate:

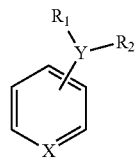

[Chemical Formula 1]

in the above Chemical Formula 1,

X and Y are each independently nitrogen, carbon, sulfur, or oxygen, $R_1$ and $R_2$ are each independently hydrogen, oxygen, a hydroxy group (—OH), or a linear or branched $C_1$ to $C_{10}$ alkyl group.

In accordance with an embodiment of the present disclosure, the compound may include a compound represented by the following Chemical Formula 2, but may not be limited thereto:

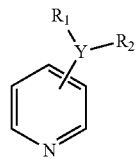

[Chemical Formula 2]

in the above Chemical Formula 2, $R_1$ and $R_2$ are each independently hydrogen, oxygen, a hydroxy group (—OH), or a linear or branched $C_1$ to $C_{10}$ alkyl group.

In accordance with an embodiment of the present disclosure, the dispersion solution may further contain a nanomaterial, but may not be limited thereto.

In accordance with an embodiment of the present disclosure, the nanomaterial may be embedded on the substrate by the compound represented by Chemical Formula 1, but may not be limited thereto. In accordance with an embodiment of the present disclosure, the nanomaterial may include a material having a shape selected from the group consisting of nanowire, nanoparticle, nanotube, nanofiber, nanorod, and combinations thereof, but may not be limited thereto.

In accordance with an embodiment of the present disclosure, the nanomaterial may contain a metal selected from the group consisting of Ag, Au, Pt, Al, Cu, Cr, V, Mg, Ti, Sn, Pb, Pd, W, Ni, and combinations thereof, but may not be limited thereto.

In accordance with an embodiment of the present disclosure, the nanomaterial may include a silver (Ag) nanowire, but may not be limited thereto.

In accordance with an embodiment of the present disclosure, the annealing may be performed at from 20° C. to 300° C., but may not be limited thereto.

In accordance with an embodiment of the present disclosure, the dispersion solution may contain a solvent selected from the group consisting of isopropyl alcohol, water, ethylene glycol, diethylene glycol, polyethylene glycol, glycerol, propyl glycol, pentaerythritol, vinyl alcohol, polyvinyl alcohol, and combinations thereof, but may not be limited thereto.

In accordance with an embodiment of the present disclosure, the substrate may include a substrate selected from the group consisting of a metal substrate, a plastic substrate, a glass substrate, a silicon substrate, a silicon oxide substrate, a Teflon film substrate, a sapphire substrate, a nitride substrate, and combinations thereof, but may not be limited thereto.

In accordance with an embodiment of the present disclosure, the metal substrate may contain a metal element selected from the group consisting of Cu, Al, Fe, Ni, Au, Pt, Ag, and combinations thereof, but may not be limited thereto.

In accordance with an embodiment of the present disclosure, the plastic substrate may include a plastic substrate selected from the group consisting of polyethylene terephthalate (PET), poly(ether sulfone) (PES), polyethylene naphthalate (PEN), polycarbonate (PC), polystyrene (PS), polyimide (PI), polyethylene (PE), and combinations thereof, but may not be limited thereto.

In accordance with an embodiment of the present disclosure, the coating may be one selected from the group consisting of bar coating, spin coating, nozzle printing, spray coating, slot die coating, gravure printing, ink jet printing, screen printing, electrohydrodynamic jet printing, electrospray, and combinations thereof, but may not be limited thereto.

The above-described aspects are provided by way of illustration only and should not be construed as liming the present disclosure. Besides the above-described embodiments, there may be additional embodiments described in the accompanying drawings and the detailed description.

Effects of the Invention

According to the above-described aspects of the present disclosure, a method of preparing a monomolecular nano-thin film of the present disclosure includes coating, on a substrate, a monomolecular material dissolved in a solvent and performing annealing to the substrate to form a monomolecular nano-thin film. The monomolecular nano-thin film is different in configuration from a thin film formed by polymerization reaction and produced by a relatively simple process compared to chemical vapor deposition, physical vapor deposition, and the like. Therefore, it is advantageous for mass production.

Further, in the method of preparing a nano-thin film of the present disclosure, the annealing is performed at relatively low temperatures. Therefore, it is possible to reduce costs required for manufacturing.

Furthermore, the monomolecular nano-thin film prepared by the method of preparing a nano-thin film of the present disclosure has excellent adhesive force. Therefore, it is possible to enhance the adhesive strength between the substrate and a target object.

Moreover, the monomolecular nano-thin film prepared by the method of preparing a nano-thin film of the present disclosure has high transmittance to visible light. Therefore, even if the monomolecular nano-thin film is formed on a transparent substrate, the transparency of the substrate can be maintained.

Also, in the method of preparing a nano-thin film of the present disclosure, a compound that enhances adhesive force between the substrate and a nanomaterial is used as an additive without performing an additional surface treatment and using any complicated process equipment. Therefore, it is easy to achieve low-cost process and commercialize the process.

The nano-thin film prepared by the method of preparing a nano-thin film of the present disclosure can have a smoothed surface compared to a conventional nanomaterial thin film and thus can have a lower optical haze than the conventional nanomaterial thin film.

According to the method of preparing a nano-thin film of the present disclosure, the nanomaterial is embedded on the substrate by the compound. Therefore, it is possible to improve the oxidation and chemical durability of the nano-thin film.

Further, according to the method of preparing a nano-thin film of the present disclosure, the addition of the compound can enhance the adhesive force and mechanical durability between the nanomaterial and the substrate without any effect on the transmittance and electrical conductivity of the nano-thin film.

In addition, the nano-thin film prepared by the method of preparing a nano-thin film of the present disclosure has excellent insulating properties and thus can be used for an insulating film or a sealing film within a transistor.

However, the effects to be obtained by the present disclosure are not limited to the above-described effects. There may be other effects to be obtained by the present disclosure.

DESCRIPTION OF THE DRAWINGS

The patent or application file contains at least one drawing executed in color. Copies of this patent or patent application publication with color drawing(s) will be provided by the Office upon request and payment of the necessary fee.

Figure 5:
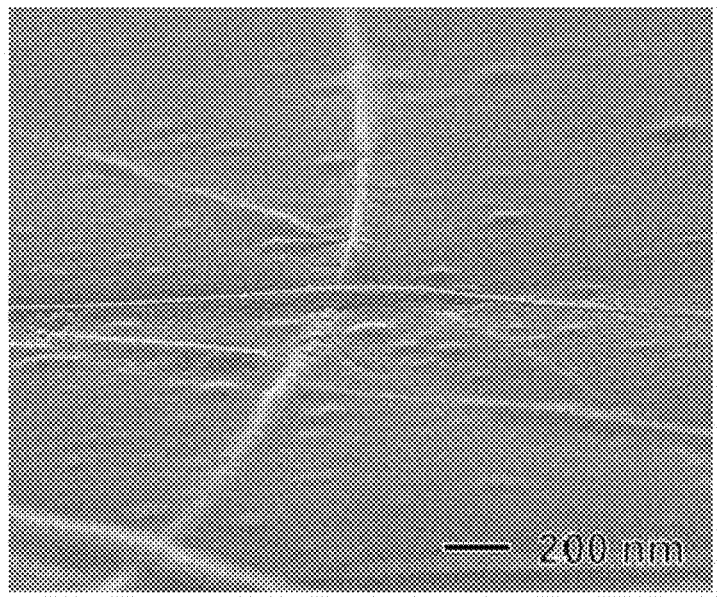
Figure 5:
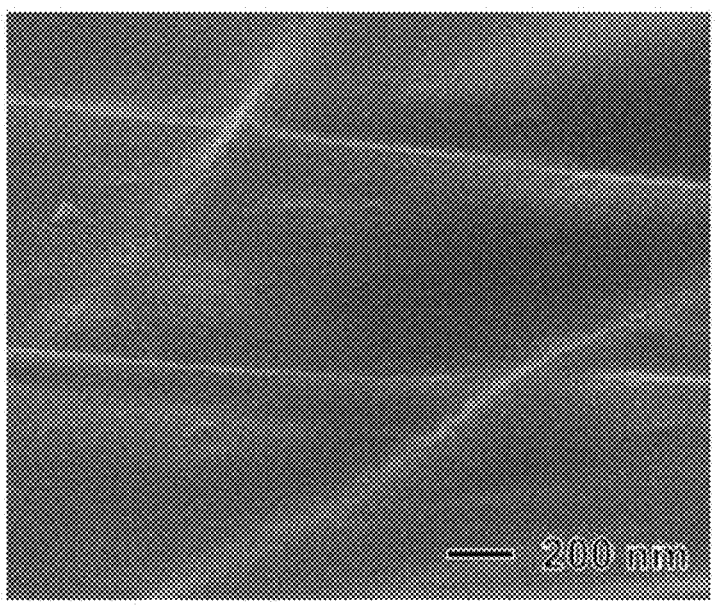

(a) and (b) of FIG. 5 are scanning electron microscopy images of nano-thin films prepared according to Example 1 and Example 2, respectively, of the present disclosure.

Figure 6:
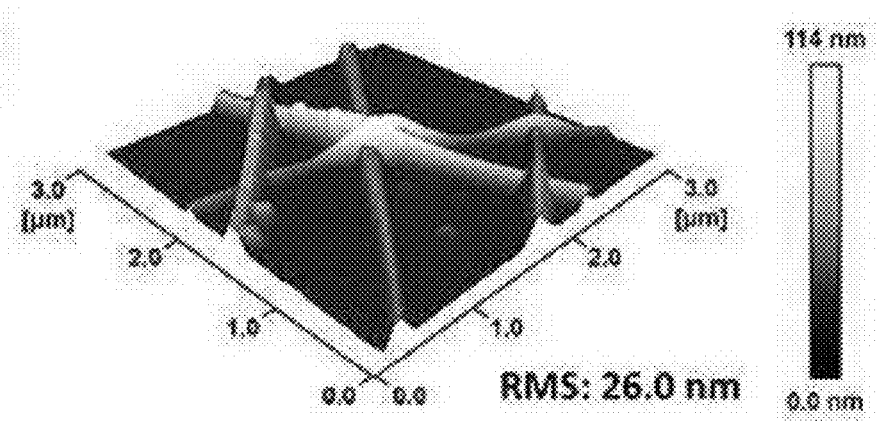
Figure 6:
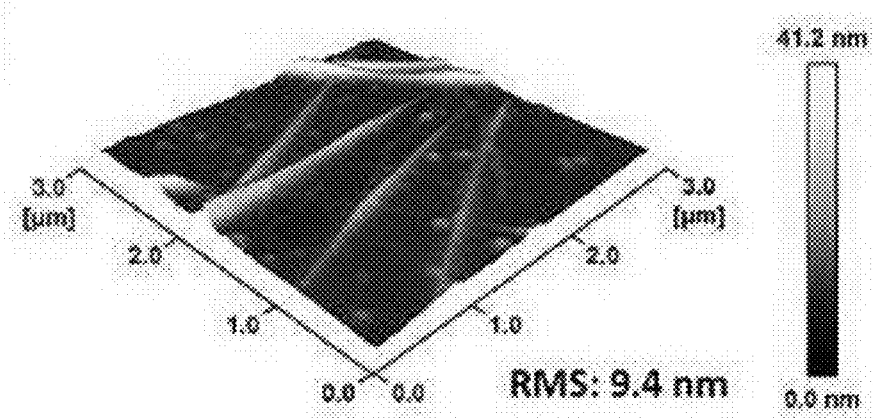

(a) and (b) of FIG. 6 are scanning probe microscopy images of nano-thin films prepared according to Example 1 and Comparative Example 1, respectively, of the present disclosure.

Figure 7:
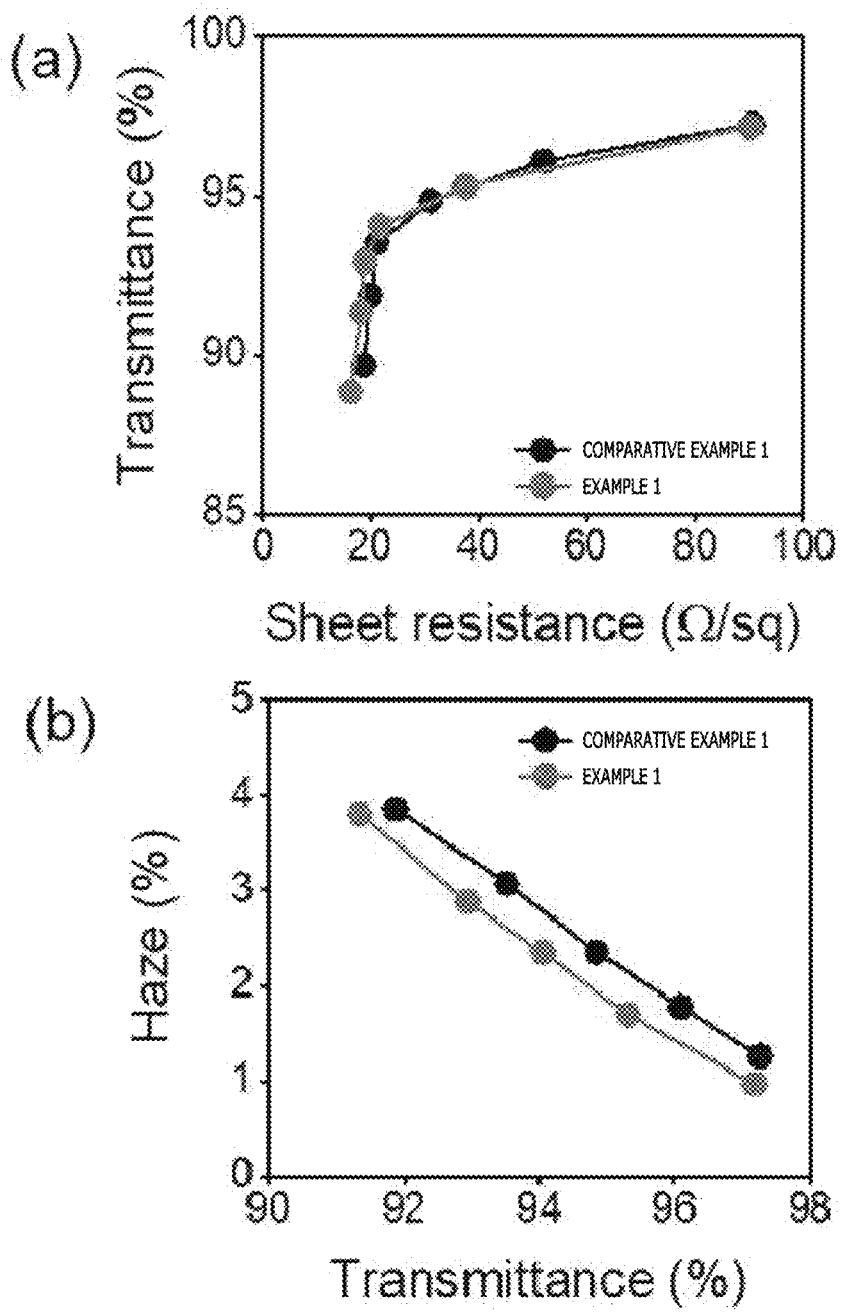

(a) and (b) of FIG. 7 show a transmittance-sheet resistance graph and a transmittance-haze graph of nano-thin films prepared according to Example 1 and Comparative Example 1, respectively, of the present disclosure.

Figure 8:
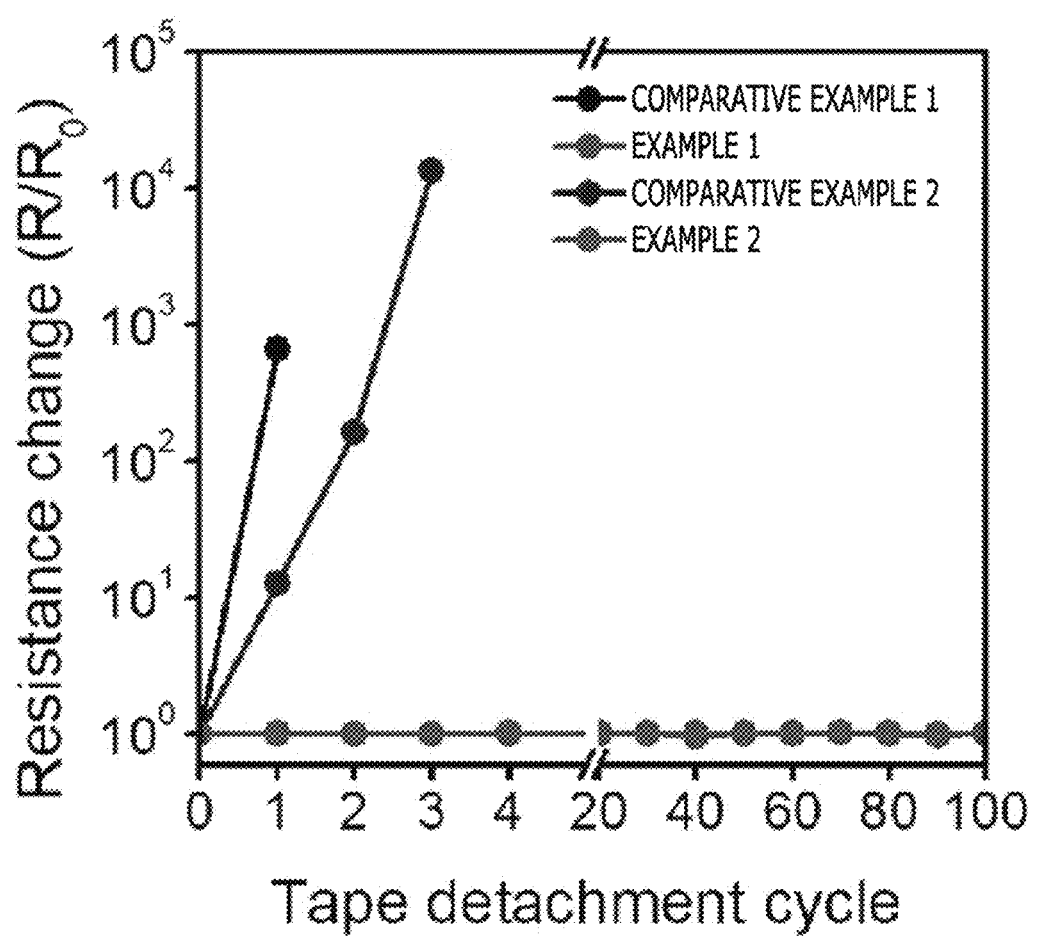

FIG. 8 is a graph showing the result of Scotch tape detachment test using nano-thin films respectively prepared according to Example 1, Example 2, Comparative Example 1, and Comparative Example 2 of the present disclosure.

Figure 9:
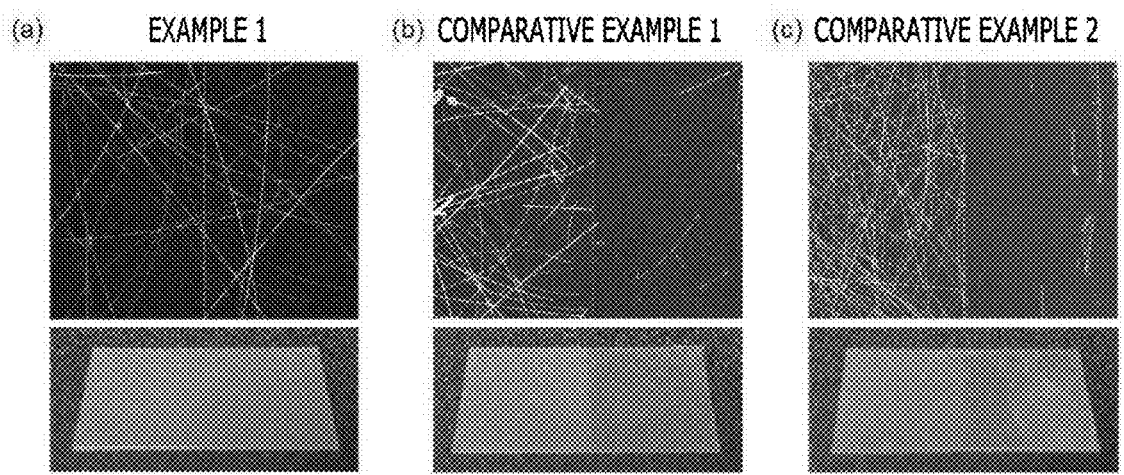

(a) to (c) of FIG. 9 are scanning electron microscopy images and photographs of nano-thin films prepared according to Example 1, Comparative Example 1, and Comparative Example 2, respectively, of the present disclosure after Scotch tape detachment test.

Figure 10:
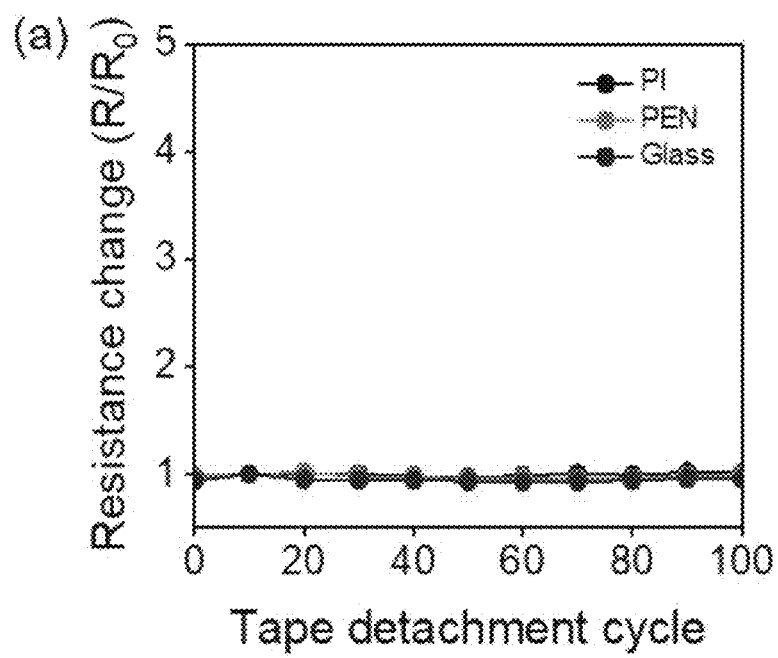
Figure 10:
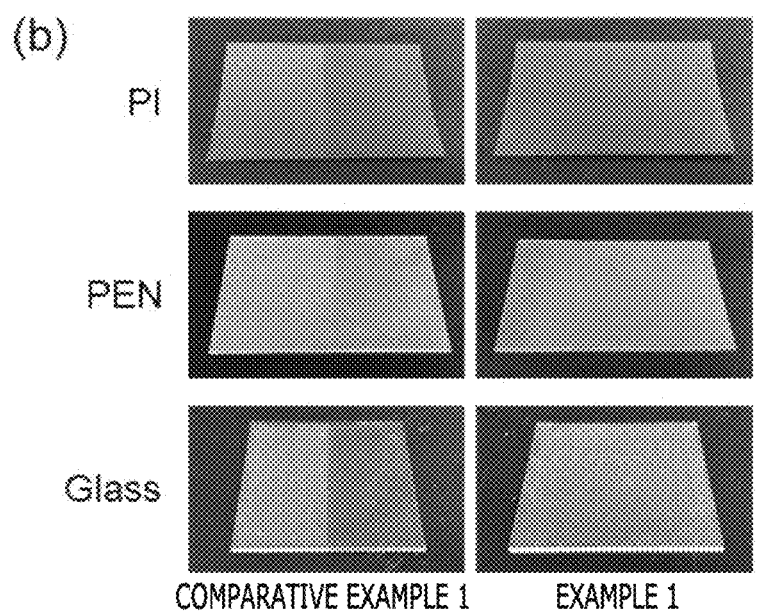

(a) of FIG. 10 shows the result of Scotch tape detachment test of a nano-thin film prepared according to Example 1 of the present disclosure on various substrates, and (b) of FIG. 10 shows photographs of nano-thin films respectively prepared according to Example 1 and Comparative Example 1 of the present disclosure after Scotch tape detachment.

Figure 11:
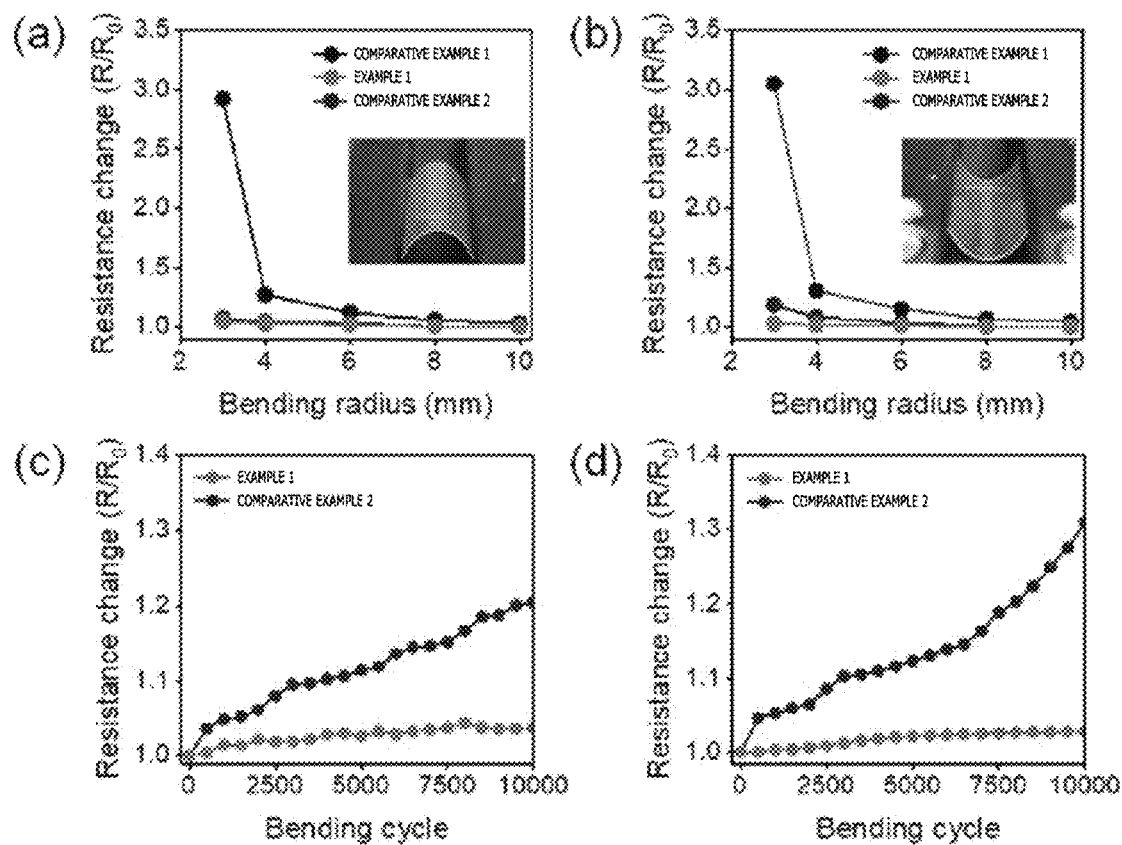

(a) to (d) of FIG. 11 are graphs showing the results of bending test and repeated bending test of nano-thin films respectively prepared according to Example 1, Comparative Example 1, and Comparative Example 2 of the present disclosure.

Figure 12:
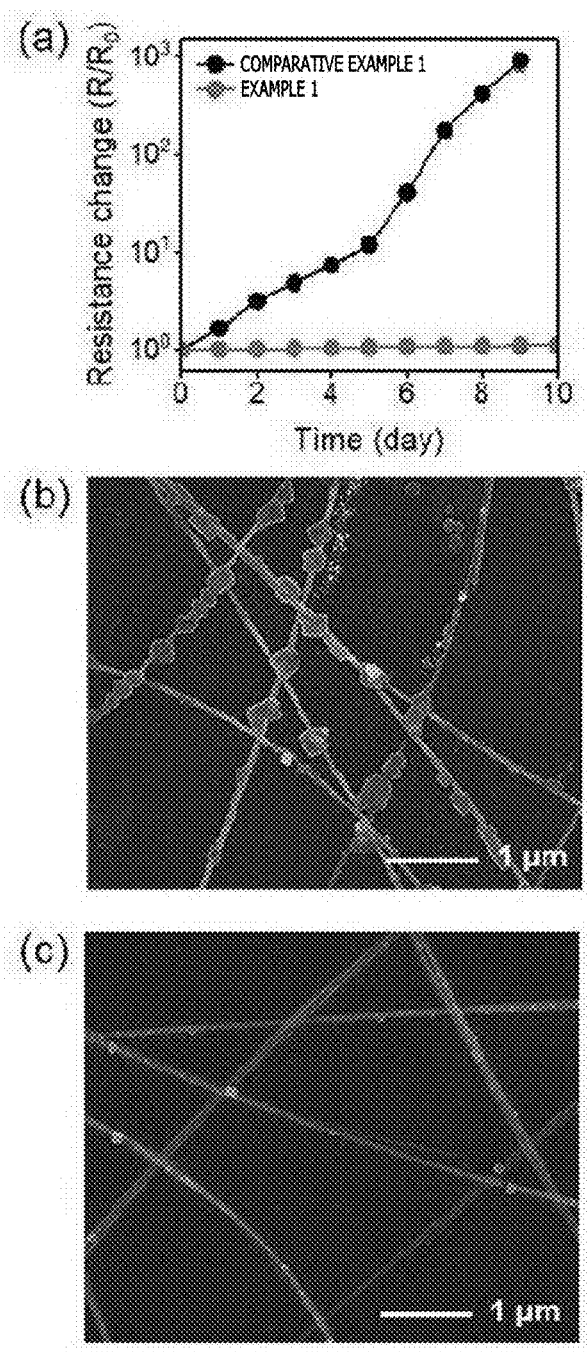

(a) of FIG. 12 is a resistance change graph of nano-thin films respectively prepared according to Example 1 and Comparative Example 1 of the present disclosure depending on exposure to air of 50° C., and (b) and (c) of FIG. 12 are scanning electron microscopy images of the nano-thin films prepared according to Example 1 and Comparative Example 1, respectively, of the present disclosure after 10 days of exposure to air of 50° C.

Figure 13:
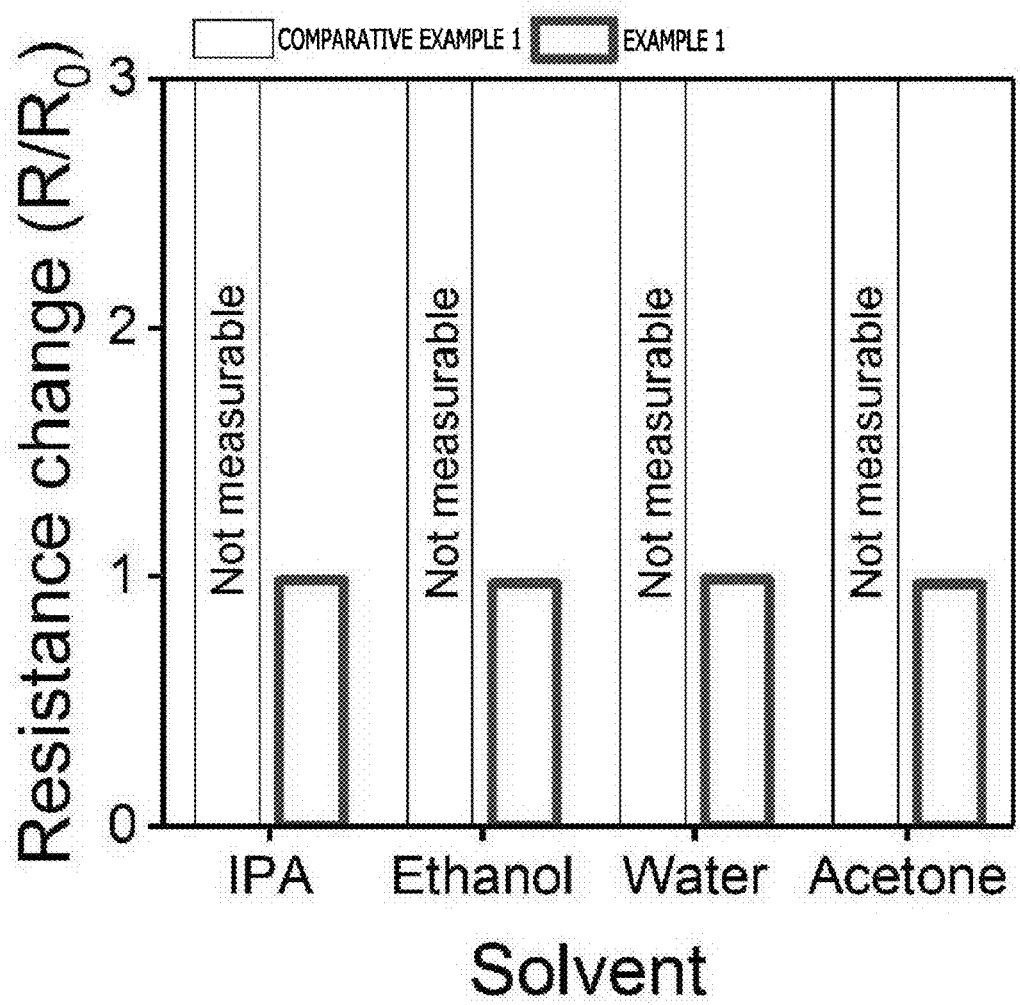

FIG. 13 is a resistance change graph of nano-thin films respectively prepared according to Example 1 and Comparative Example 1 of the present disclosure after the nano-thin films are immersed in respective solvents and sonicated for 5 minutes.

Figure 14:
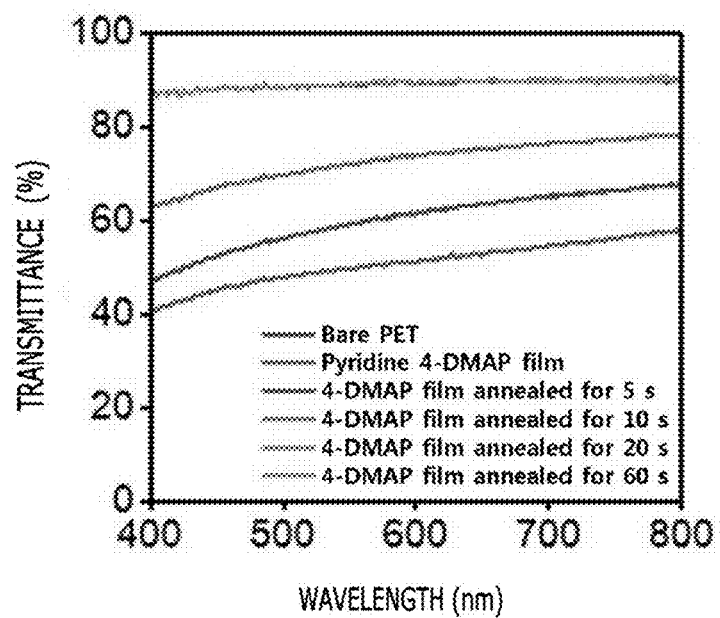

FIG. 14 is a wavelength-transmittance graph of monomolecular nano-thin films respectively according to Example 3 of the present disclosure.

Figure 15:
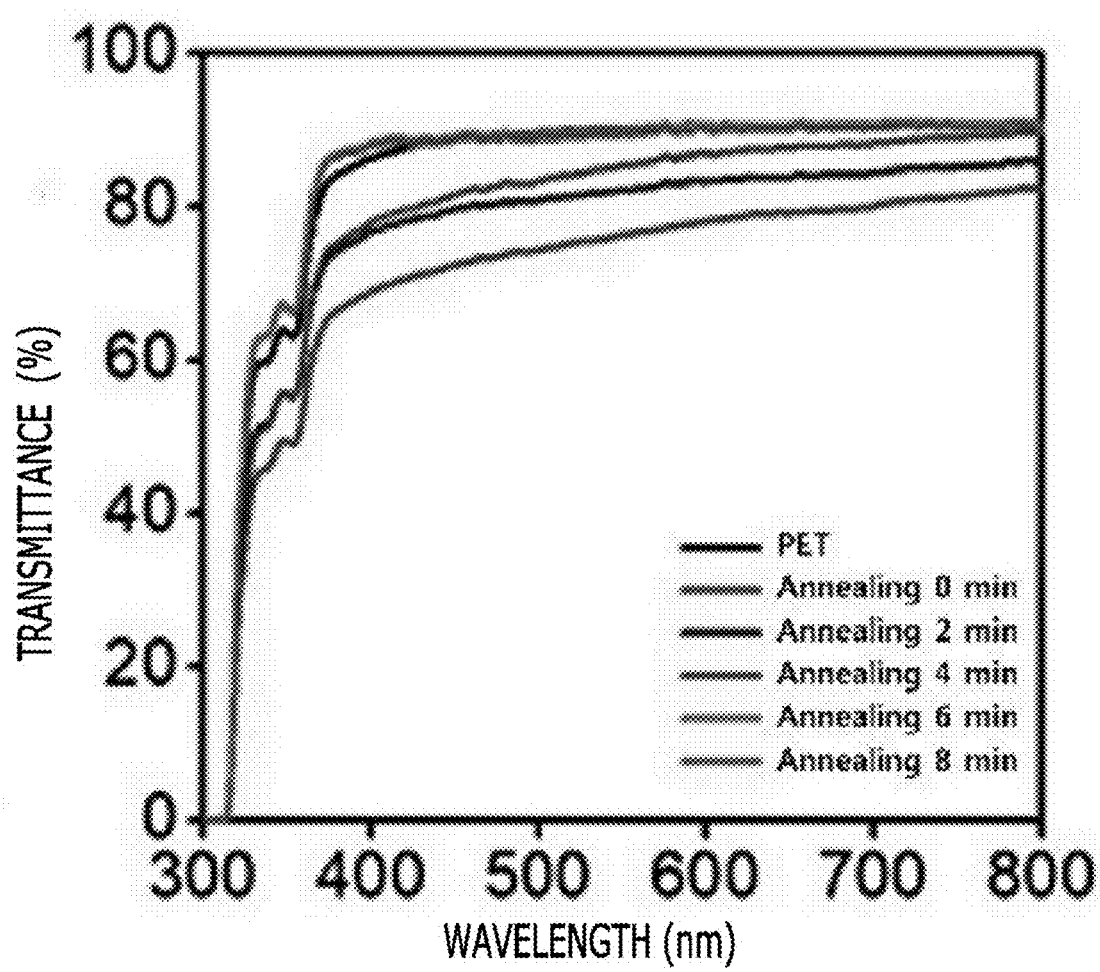

FIG. 15 is a wavelength-transmittance graph of monomolecular nano-thin films respectively according to Example 3 of the present disclosure.

Figure 16:
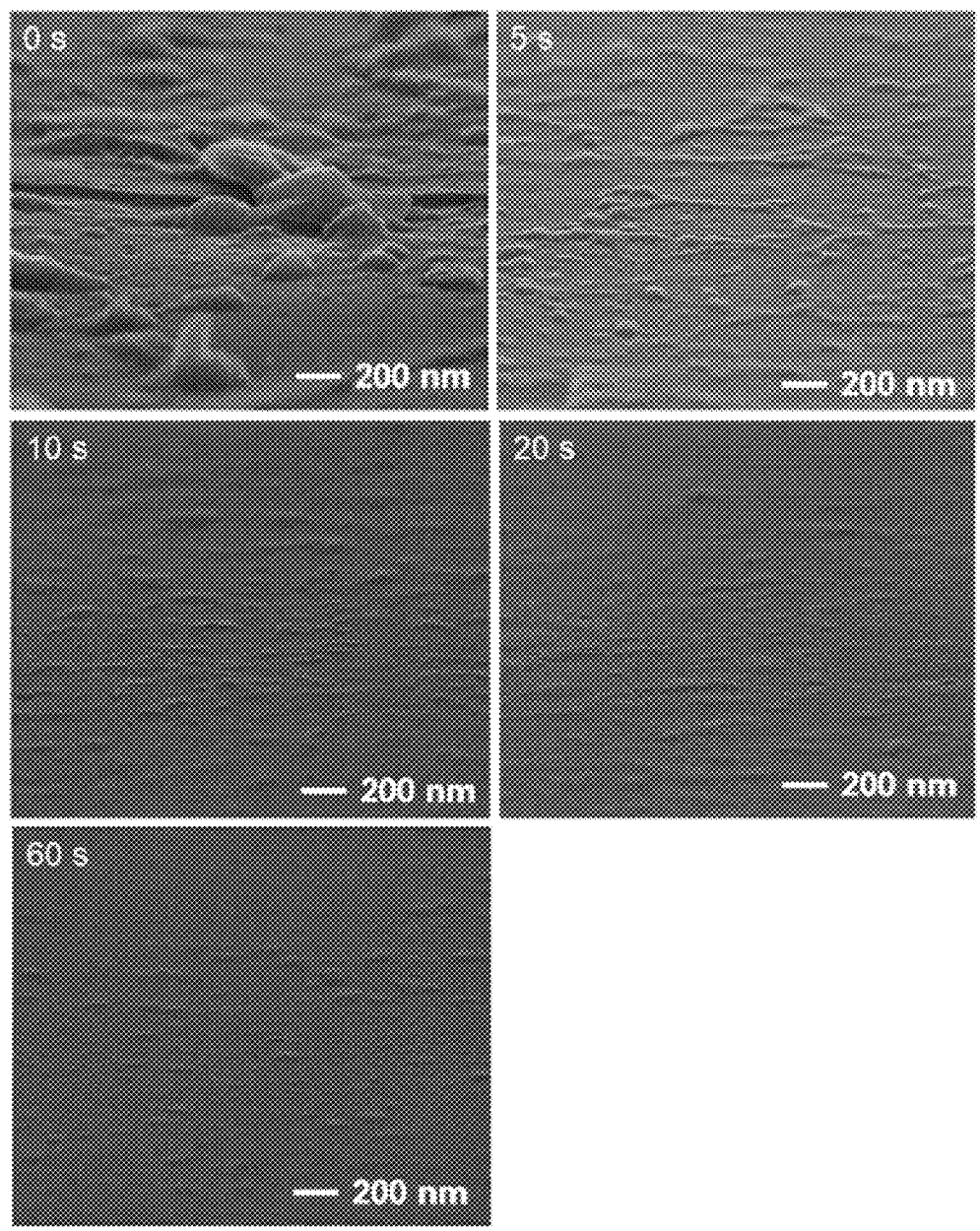

FIG. 16 shows images of the surface of a monomolecular nano-thin film over annealing time in a method of preparing a monomolecular nano-thin film according to Example 3 of the present disclosure.

Figure 17:
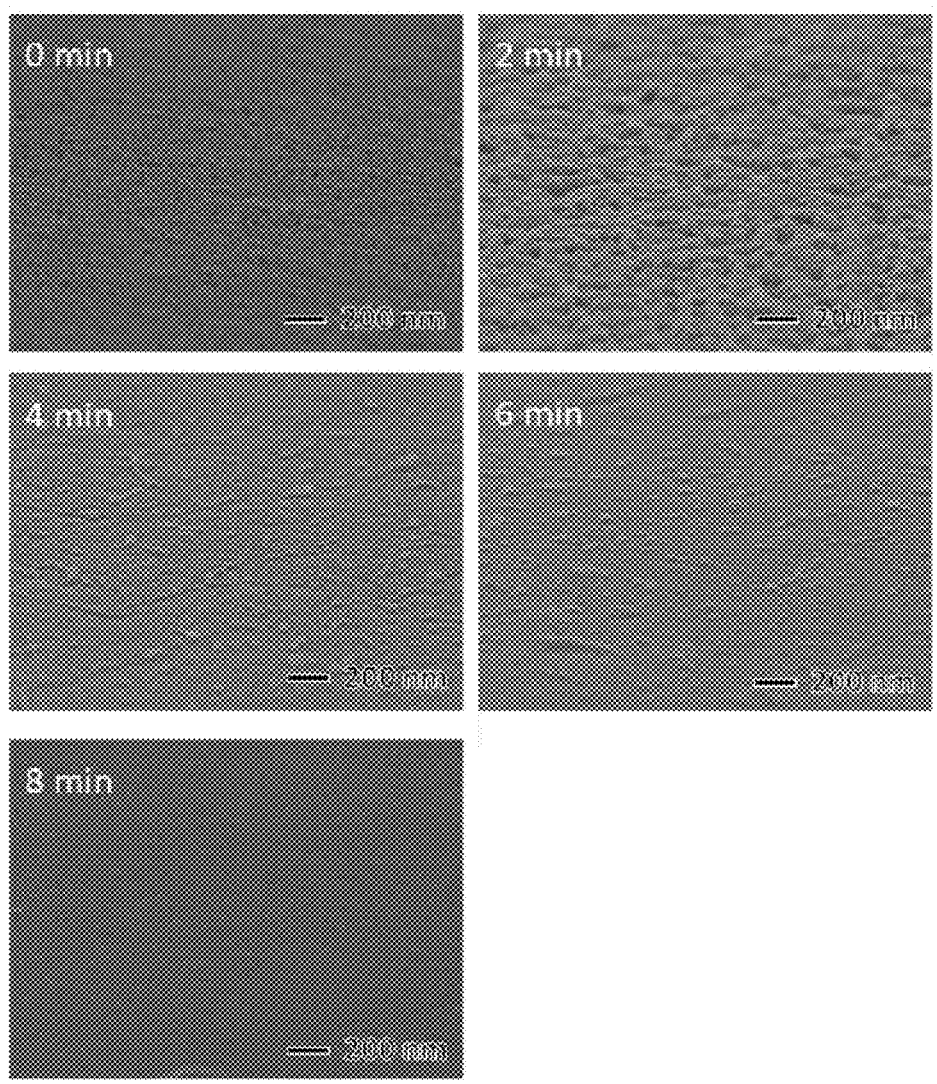

FIG. 17 shows images of the surface of a monomolecular nano-thin film over annealing time in a method of preparing a monomolecular nano-thin film according to Example 3 of the present disclosure.

Figure 18:
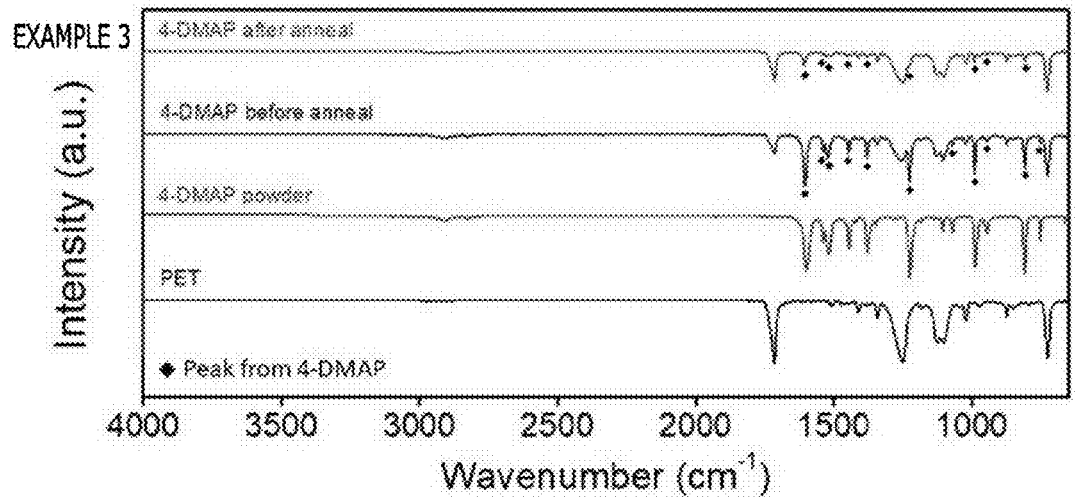
Figure 18:
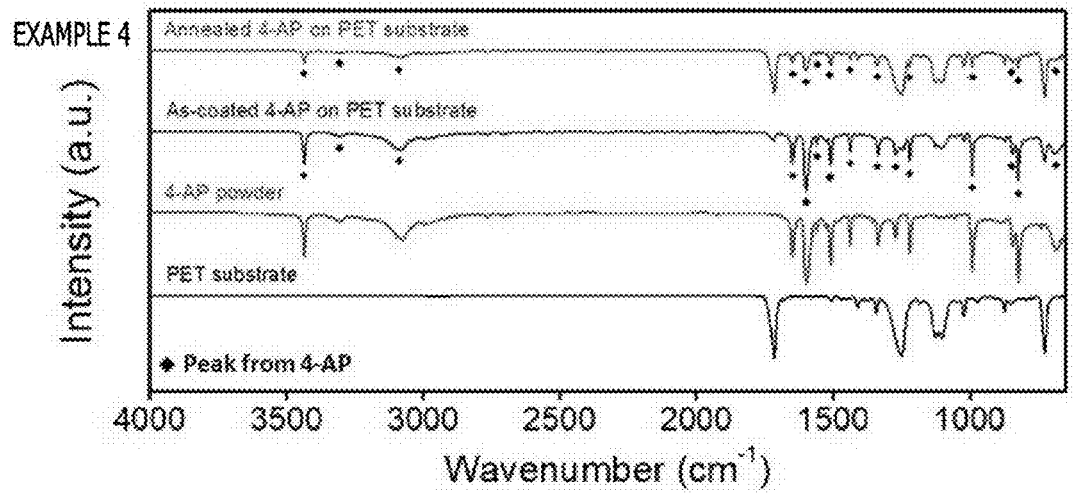

FIG. 18 shows FT-IR graphs of monomolecular thin films coated on PET substrates according to Example 3 and Example 4, respectively, of the present disclosure.

Figure 19:
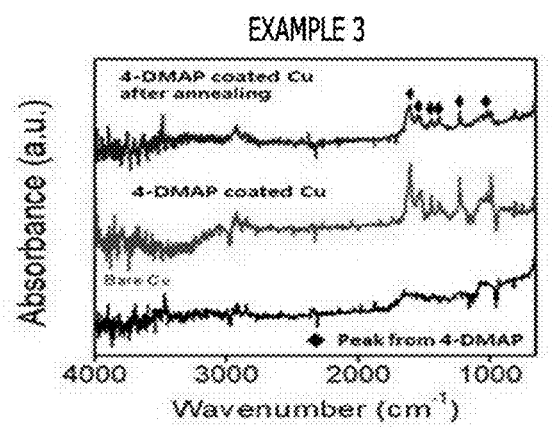
Figure 19:
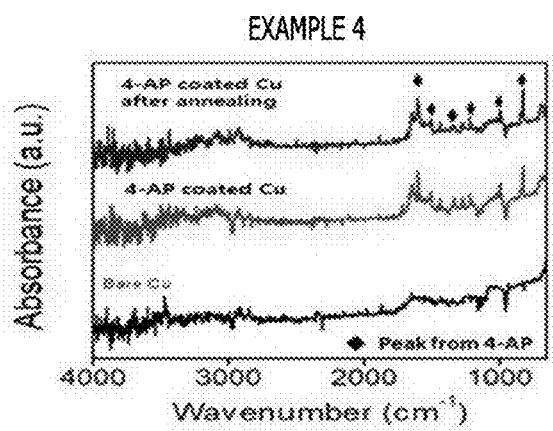
Figure 19:
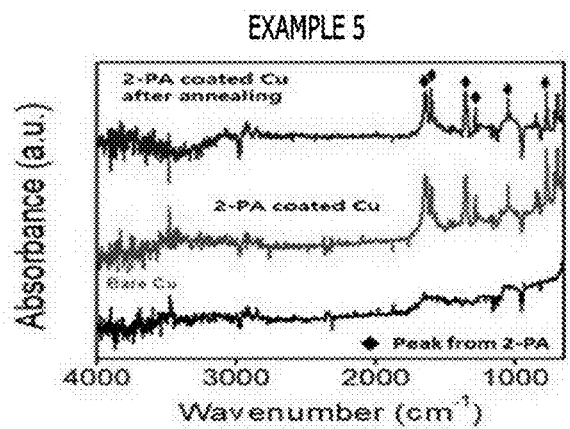

FIG. 19 shows FT-IR graphs of monomolecular thin films coated on Cu films according to Example 3 to Example 5, respectively, of the present disclosure.

Figure 20:
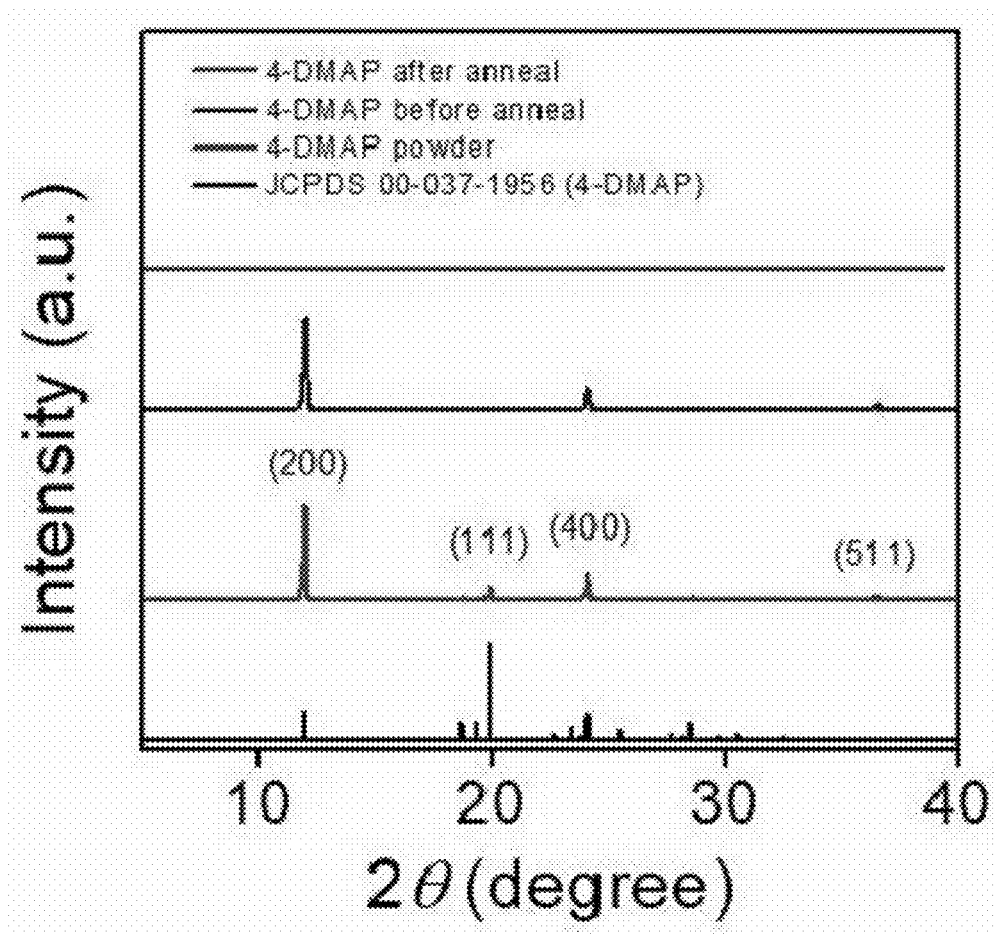

FIG. 20 is an XRD graph of a monomolecular thin film according to Example 3 of the present disclosure.

Figure 21:
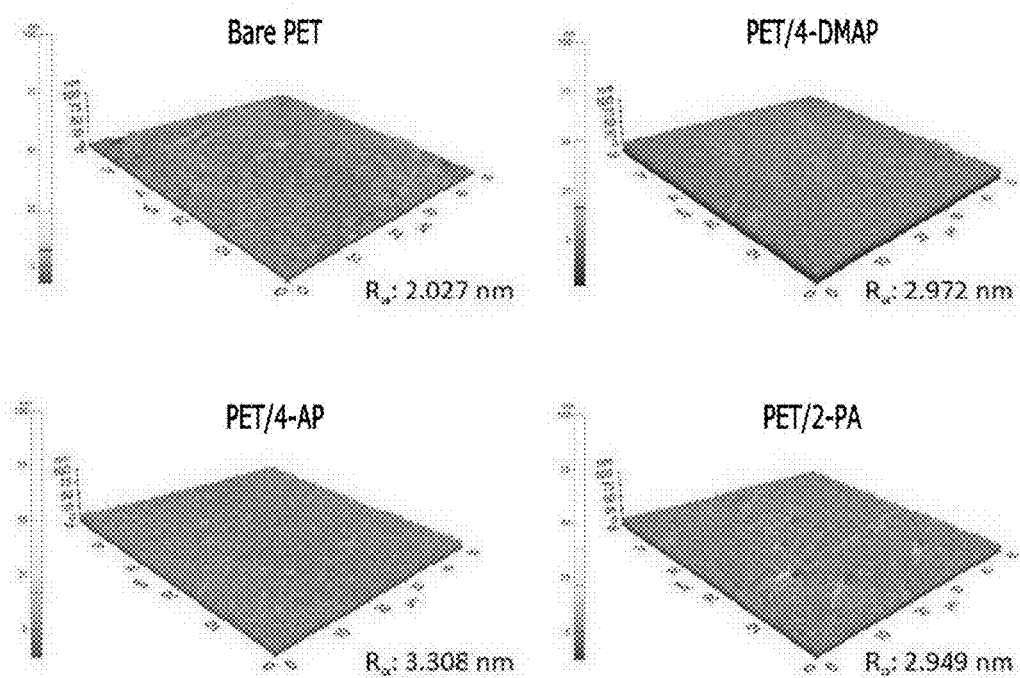

FIG. 21 shows AFM images of the surface morphology of bare PET and monomolecular thin films according to Example 3 to Example 5, respectively, of the present disclosure.

Figure 22:
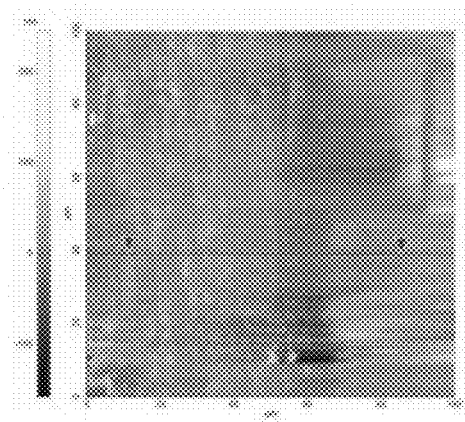
Figure 22:
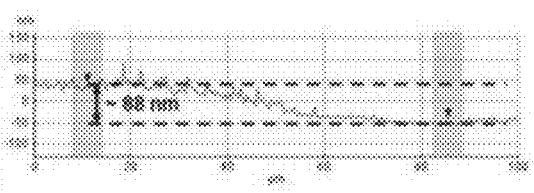
Figure 22:
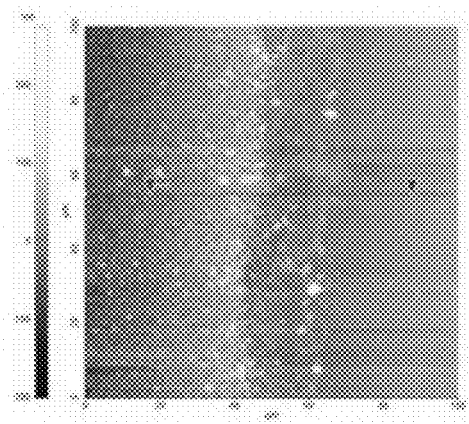
Figure 22:
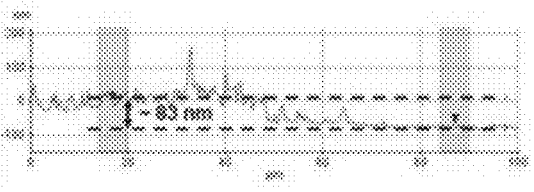
Figure 22:
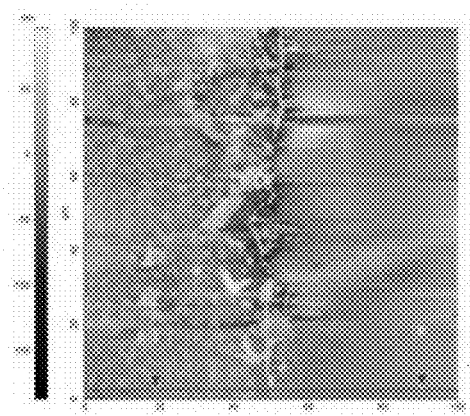
Figure 22:
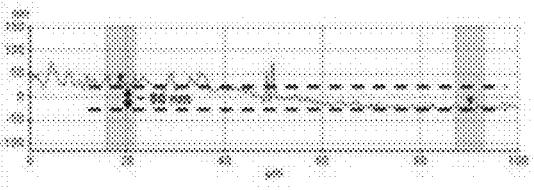

FIG. 22 shows AFM images of steps of monomolecular thin films according to Example 3 to Example 5 of the present disclosure.

Figure 23:
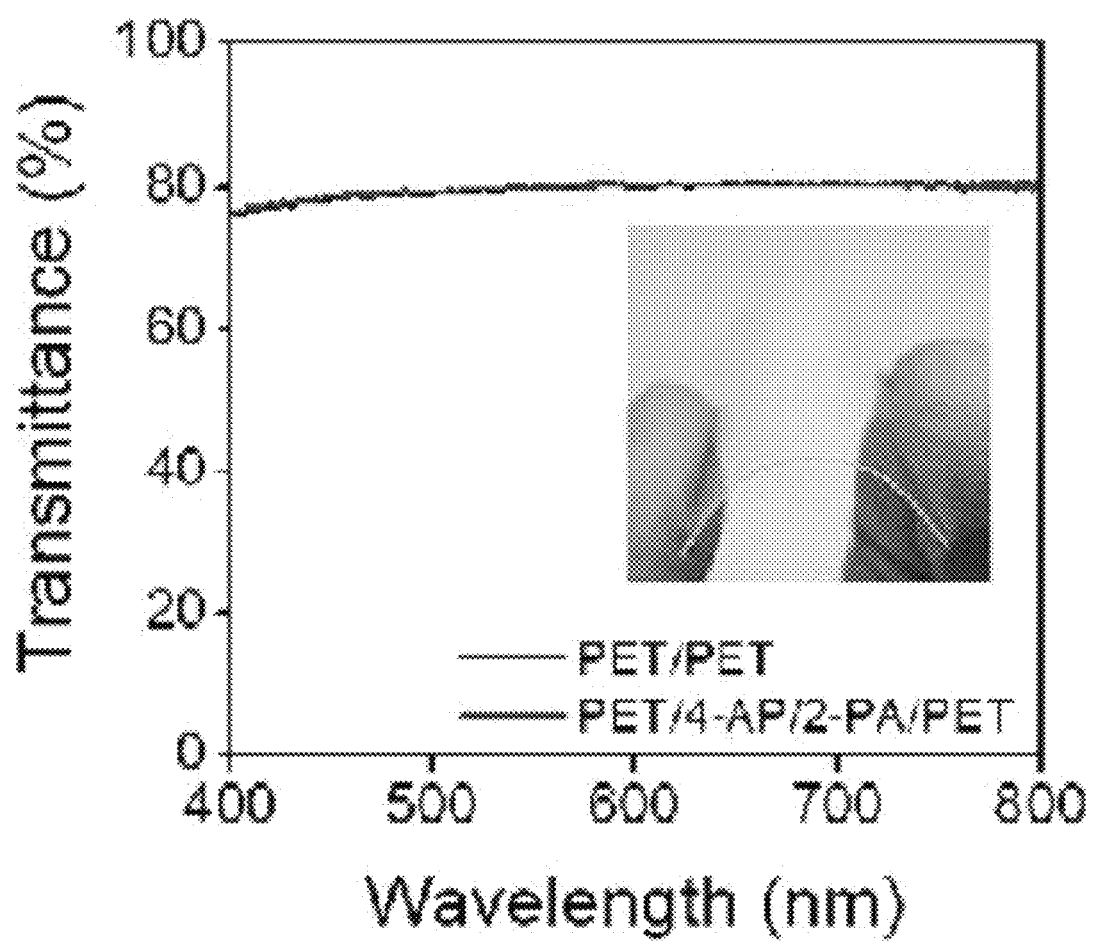

FIG. 23 is a wavelength-transmittance graph of a specimen according to Example 8 of the present disclosure.

Figure 24:
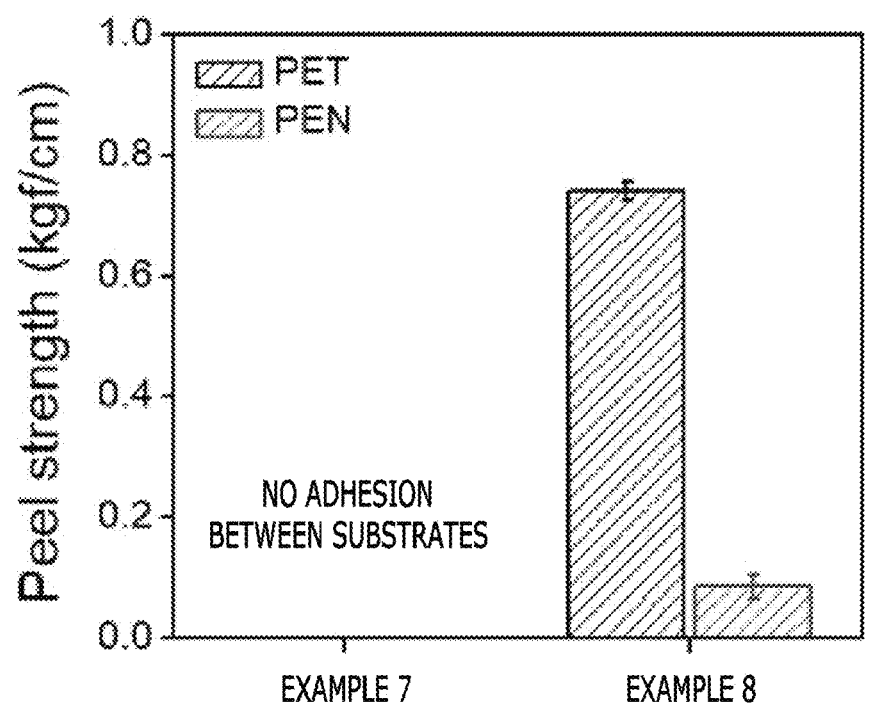

FIG. 24 is a graph showing the adhesive strength of bonded polymer substrates respectively according to Example 7 and Example 8 of the present disclosure.

DETAILED DESCRIPTION OF THE EMBODIMENT

Hereinafter, embodiments of the present disclosure will be described in detail with reference to the accompanying drawings so that the present disclosure may be readily implemented by those skilled in the art.

However, it is to be noted that the present disclosure is not limited to the embodiments but can be embodied in various other ways. In drawings, parts irrelevant to the description are omitted for the simplicity of explanation, and like reference numerals denote like parts through the whole document. Through the whole document, the term "connected to" or "coupled to" that is used to designate a connection or coupling of one element to another element includes both a case that an element is "directly connected or coupled to" another element and a case that an element is "electronically connected or coupled to" another element via still another element.

Through the whole document, the terms "on", "above", "on an upper end", "below", "under", and "on a lower end" that are used to designate a position of one element with respect to another element include both a case that the one element is adjacent to the other element and a case that any other element exists between these two elements.

Further, through the whole document, the term "comprises or includes" and/or "comprising or including" used in the document means that one or more other components, steps, operation and/or existence or addition of elements are not excluded in addition to the described components, steps, operation and/or elements unless context dictates otherwise.

Through the whole document, the term "about or approximately" or "substantially" is intended to have meanings close to numerical values or ranges specified with an allowable error and intended to prevent accurate or absolute numerical values disclosed for understanding of the present disclosure from being illegally or unfairly used by any unconscionable third party. Through the whole document, the term "step of" does not mean "step for".

Through the whole document, the term "combination of" included in Markush type description means mixture or combination of one or more components, steps, operations and/or elements selected from a group consisting of components, steps, operation and/or elements described in Markush type and thereby means that the disclosure includes one or more components, steps, operations and/or elements selected from the Markush group.

Through the whole document, a phrase in the form "A and/or B" means "A or B, or A and B".

Hereafter, a method of preparing a nano-thin film according to the present disclosure will be described in detail with reference to embodiments, examples, and the accompanying drawings. However, the present disclosure may not be limited to the following embodiments, examples, and drawings.

A first aspect of the present disclosure provides method of preparing a monomolecular nano-thin film, including: coating, on a substrate, a dispersion solution containing a compound represented by the following Chemical Formula 1; and performing annealing to the coated substrate:

[Chemical Formula 1]

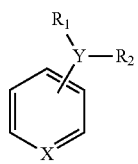

in the above Chemical Formula 1,

X and Y are each independently nitrogen, carbon, sulfur, or oxygen, $R_1$ and $R_2$ are each independently hydrogen, oxygen, a hydroxy group (—OH), or a linear or branched $C_1$ to $C_{10}$ alkyl group.

Figure 1:
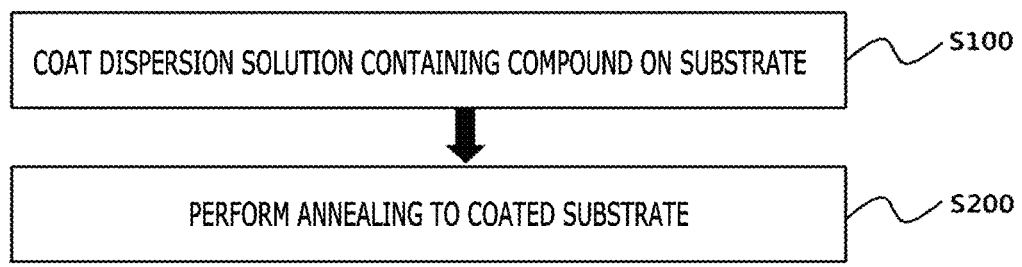
FIG. 1 is a flowchart of a method of preparing a nano-thin film according to an embodiment of the present disclosure.

FIG. 1 is a flowchart of a method of preparing a nano-thin film according to an embodiment of the present disclosure.

First, a dispersion solution containing a compound represented by the following Chemical Formula 1 is coated on a substrate (S100):

[Chemical Formula 1]

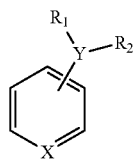

in the above Chemical Formula 1,

X and Y are each independently nitrogen, carbon, sulfur, or oxygen, $R_1$ and $R_2$ are each independently hydrogen, oxygen, a hydroxy group (—OH), or a linear or branched $C_1$ to $C_{10}$ alkyl group.

In accordance with an embodiment of the present disclosure, the compound may include a compound represented by the following Chemical Formula 2, but may not be limited thereto:

[Chemical Formula 2]

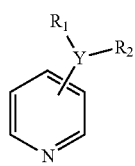

in the above Chemical Formula 2, $R_1$ and $R_2$ are each independently hydrogen, oxygen, a hydroxy group (—OH), or a linear or branched $C_1$ to $C_{10}$ alkyl group.

In the above Chemical Formulas 1 and 2, bonds of Y, $R_1$, and $R_2$ can be controlled variously depending on the kind of Y, $R_1$, and $R_2$ according to their stoichiometric ratio.

To be specific, in the above Chemical Formulas 1 and 2, if $R_1$ or $R_2$ is hydrogen, a hydroxy group, or a linear or branched $C_1$ to $C_{10}$ alkyl group, the hydrogen, hydroxy group, or linear or branched $C_1$ to $C_{10}$ alkyl group has a single dangling bond, and, thus, they can form a single bond to Y in a normal manner. However, if $R_1$ or $R_2$ is oxygen, the oxygen has two dangling bonds, and, thus, they cannot form a single bond to Y. Therefore, if $R_1$ or $R_2$ is oxygen, Y and $R_1$ or $R_2$ need to form a double bond by stoichiometric bonding.

For example, if Y is carbon and $R_1$ or $R_2$ is oxygen, the carbon (Y) and the oxygen ($R_1$ or $R_2$) may form a double bond.

For example, if any one of $R_1$ or $R_2$ is oxygen, the material represented by Chemical Formula 2 may include the following material:

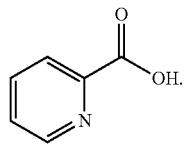

The compound represented by Chemical Formula 1 may include the compound represented by Chemical Formula 2, but may not be limited thereto.

Desirably, the compound may be 4-dimethylaminopyridine (4-DMAP), 4-aminopyridine (4-AP), 3-dimethylaminopyridine (3-DMAP), 3-aminopyridine (3-AP), 2-dimethylaminopyridine (2-DMAP), 2-aminopyridine (2-AP), or 2-picolinic acid (2-PA), but may not be limited thereto.

4-DMAP is a colorless crystalline compound with a melting point of from 112° C. to 113° C. 4-DMAP is dissolved in ethanol, acetone, acetate, chloroform, and the like and slightly dissolved in chlorohexane and water. Meanwhile, 4-DMAP can be obtained with a sufficient yield by reaction between N, N-dimethylformamide and 1-(4-pyridino) pyridinium dichloride. The first one can be easily obtained from pyridine and thionyl chloride. This is $10^4$ times more effective as an acylation catalyst than pyridine and thus has been increasing used for acylation where catalysis is not sufficient with pyridine. The excellent catalytic effect of 4-DMAP originates from the fact that N-acyl pyridinium salt is highly enriched even in a nonpolar solvent and the salt is present as a loose ion pair.

4-AP is one of calcium channel blockers as a secondary effect of calcium currents and has been mainly used as a research tool or a channel subtype.

2-PA is a white crystalline solid compound at room temperature and is obtained by oxidizing α-picoline with potassium permanganate. 2-PA is well dissolved in a polar solvent such as acetic acid, water, and ethanol and not dissolved in a nonpolar solvent such as benzene, ether, and the like and has high sublimation properties.

The compound represented by Chemical Formula 1, such as 4-DMAP, 4-AP, or 2-PA, connects two different materials on its both ends and enhances adhesive force between the two different materials.

In accordance with an embodiment of the present disclosure, the compound represented by Chemical Formula 1 may be present in a monomolecular form in the dispersion solution, but may not be limited thereto.

A self-assembled monomolecular film based on monomolecular materials according to a conventional technology can easily control the interfacial properties of a substrate. However, the self-assembled monomolecular film uses cross-linking between the monomolecular materials or cross-linking between the monomolecular materials and the substrate. Therefore, a pre-treatment needs to be performed to the substrate before the monomolecular film is formed, and there is a limit to the kind of the substrate on which the monomolecular film can be formed.

In accordance with an embodiment of the present disclosure, the dispersion solution may further contain a nanomaterial, but may not be limited thereto.

In accordance with an embodiment of the present disclosure, the nanomaterial may include a material having a shape selected from the group consisting of nanowire, nanoparticle, nanotube, nanofiber, nanorod, and combinations thereof, but may not be limited thereto.

A nanowire is a linear nanomaterial having a diameter of from several nm to several hundreds of nm. The nanowire has been applied to various fields such as laser, transistor, memory, chemical detection sensor (detector), and the like.

A nanoparticle is an ultrafine particle having a particle size of from several nm to several hundreds of nm. The nanoparticle has various specific properties resulting from its small size and thus has been widely used in manufacturing of biochips, micro biosensors, displays, and the like.

A nanotube is a tube-like molecule or molecular aggregate having a tunnel structure with a diameter of from several nm to several hundreds of nm.

A nanofiber is a fiber prepared by combining the nanotechnology with the fiber technology and having special functions totally different from those of existing fibers. The nanofiber is an ultrafine fiber having a thickness of from several tens of nm to several hundreds of nm.

A nanorod is a rod-like molecule or molecular aggregate having a diameter of from several nm to several tens of nm and a length of from several hundreds of nm to several μm.

In accordance with an embodiment of the present disclosure, the nanomaterial may contain a metal selected from the group consisting of Ag, Au, Pt, Al, Cu, Cr, V, Mg, Ti, Sn, Pb, Pd, W, Ni, and combinations thereof, but may not be limited thereto. To be specific, the nanomaterial may contain Ag.

In accordance with an embodiment of the present disclosure, the nanomaterial may include a silver (Ag) nanowire, but may not be limited thereto.

The Ag nanowire is an electrode material suitable for manufacturing a transparent conductive film because it has properties of Ag which has high chemical stability and excellent thermal conductivity and electrical conductivity among metals in addition to transparency which is one of optical characteristics resulting from a very small size of the nanowire. Therefore, the Ag nanowire can be widely applied to electric, magnetic, and optical devices and sensors such as a plasma display panel, an optical filter, an electromagnetic shielding material, an organic light-emitting diode, a solar cell, an LCD, a touch screen, an EL keypad for mobile phone, and the like.

In accordance with an embodiment of the present disclosure, the nanomaterial may be embedded on the substrate by the compound represented by Chemical Formula 1, but may not be limited thereto. Since the nanomaterial is embedded on the substrate by the compound, it is possible to improve the oxidation and durability of the nano-thin film.

The surface of the nanomaterial is modified by adding the compound to the dispersion solution, and, thus, it is possible to enhance the adhesive force and mechanical durability between the nanomaterial and the substrate. The addition of the compound to the dispersion solution does not have any effect on the transmittance and electrical conductivity of the nano-thin film.

The metal nanowire may have an aspect ratio of 5 or more, but may not be limited thereto. For example, the aspect ratio may be 5 or more, 10 or more, 100 or more, 300 or more, 500 or more, 700 or more, or 720 or more. To be specific, the metal nanowire may have an aspect ratio of from 5 to 5000, from 10 to 5000, from 100 to 5000, from 300 to 5000, from 500 to 5000, from 700 to 5000, or from 720 to 5000, but may not be limited thereto.

In accordance with an embodiment of the present disclosure, the dispersion solution may contain a solvent selected from the group consisting of isopropyl alcohol, water, ethylene glycol, diethylene glycol, polyethylene glycol, glycerol, propyl glycol, pentaerythritol, vinyl alcohol, polyvinyl alcohol, and combinations thereof, but may not be limited thereto. To be specific, the dispersion solution may contain isopropyl alcohol as a solvent.

In accordance with an embodiment of the present disclosure, the substrate may include a substrate selected from the group consisting of a metal substrate, a plastic substrate, a glass substrate, a silicon substrate, a silicon oxide substrate, a Teflon film substrate, a sapphire substrate, a nitride substrate, and combinations thereof, but may not be limited thereto.

In accordance with an embodiment of the present disclosure, the metal substrate may contain a metal element selected from the group consisting of Cu, Al, Fe, Ni, Au, Pt, Ag, and combinations thereof, but may not be limited thereto.

In accordance with an embodiment of the present disclosure, the plastic substrate may include a plastic substrate selected from the group consisting of polyethylene terephthalate (PET), poly(ether sulfone) (PES), polyethylene naphthalate (PEN), polycarbonate (PC), polystyrene (PS), polyimide (PI), polyethylene (PE), and combinations thereof, but may not be limited thereto.

In accordance with an embodiment of the present disclosure, the coating may be one selected from the group consisting of bar coating, spin coating, nozzle printing, spray coating, slot die coating, gravure printing, ink jet printing, screen printing, electrohydrodynamic jet printing, electrospray, and combinations thereof, but may not be limited thereto. Desirably, the coating may be performed by bar coating.

Bar coating is a method for large-area coating by applying, only once, an ink formed of electronic materials used for manufacturing of flexible electrodes and enables fast and uniform coating. Further, bar coating can be performed simply without an additional tool. Also, a flexible electrode coated by bar coating is verified as having two to ten times higher performance than a flexible electrode coated by the existing process.

Then, the annealing is performed to the coated substrate (S200).

In accordance with an embodiment of the present disclosure, the annealing may be performed at from 20° C. to 350° C., but may not be limited thereto.

For example, the annealing may be performed at from about 20° C. to about 350° C., from about 50° C. to about 350° C., from about 75° C. to about 350° C., from about 100° C. to about 350° C., from about 125° C. to about 350° C., from about 150° C. to about 350° C., from about 175° C. to about 350° C., from about 200° C. to about 350° C., from about 225° C. to about 350° C., from about 250° C. to about 350° C., from about 275° C. to about 350° C., from about 300° C. to about 350° C., from about 325° C. to about 350° C., from about 20° C. to about 325° C., from about 20° C. to about 300° C., from about 20° C. to about 275° C., from about 20° C. to about 250° C., from about 20° C. to about 225° C., from about 20° C. to about 200° C., from about 20° C. to about 175° C., from about 20° C. to about 150° C., from about 20° C. to about 125° C., from about 20° C. to about 100° C., from about 20° C. to about 75° C., from about 20° C. to about 50° C., from about 50° C. to about 325° C., from about 75° C. to about 300° C., from about 100° C. to about 275° C., from about 125° C. to about 250° C., from about 150° C. to about 225° C., or from about 175° C. to about 200° C., but may not be limited thereto. Desirably, the annealing may be performed at about 100° C.

In accordance with an embodiment of the present disclosure, the monomolecular nano-thin film may have a peel strength of from 0.1 kgf/cm to 0.8 kgf/cm, but may not be limited thereto.

The term "peel strength" as used herein refers to the adhesive force between two or more materials which are physically or chemically bonded to each other and may also be referred to as adhesive strength, adhesive force, bond strength, and the like. The peel strength can be measured by a pull test and a peel test. The pull test is used to measure the strength when two materials are completely detached from each other by pulling them from both sides. Further, the peel test is used to measure the strength when one material is completely detached from the other material which is fixed.

In accordance with an embodiment of the present disclosure, the peel strength may be measured by the peel test, but may not be limited thereto.

In accordance with an embodiment of the present disclosure, the peel strength of the monomolecular nano-thin film may vary depending on the kind of the substrate, and it is possible to determine whether two different substrates can be bonded to each other based on the peel strength.

Hereinafter, the present disclosure will be described in more detail with reference to examples. The following examples are provided only for explanation, but do not intend to limit the scope of the present disclosure.

[Example 1]: Preparation of Nano-Thin Film Containing 4-Dimethylaminopyridine (4-DMAP)

A silver nanowire solution synthesized by polyol synthesis was prepared, and 27 ml of isopropyl alcohol was added to the silver nanowire solution with stirring and centrifuged at 3000 rpm for 10 minutes to remove the solution and then dispersed in 10 ml of fresh isopropyl alcohol. Through the solvent exchange, a silver nanowire dispersion solution was obtained.

4-dimethylaminopyridine (4-DMAP) was added at 0.5 wt % to the silver nanowire dispersion solution and mixed therein. Then, the silver nanowire dispersion solution added with 4-DMAP was bar coated on a plastic substrate at a speed of 10 mm/sec. A bar coater used in the bar coating has a length of 400 mm and a thickness of 6.35 mm.

The coated thin film was annealed at 100° C. for 1 minute to prepare a silver nanowire thin film containing 4-DMAP.

[Example 2] Preparation of Nano-Thin Film Containing 4-Aminopyridine (4-AP)

In Example 2, a nano-thin film was prepared by the same method as in Example 1, and 1.0 wt % 4-AP was used instead of 0.5 wt % 4-DMAP of Example 1. The coated thin film was annealed at 150° C. instead of 100° C.

Example 3

Figure 2:
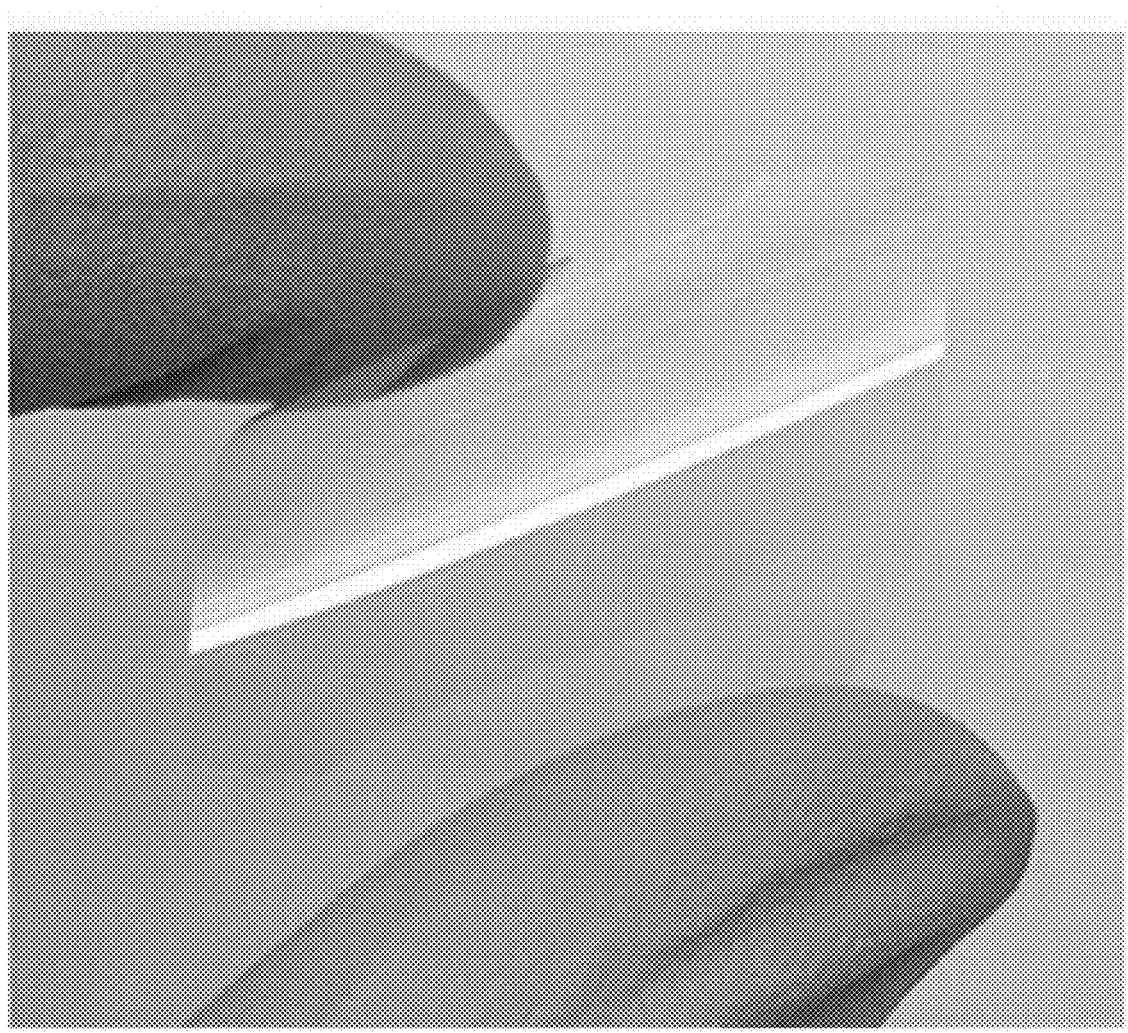
FIG. 2 is a photograph of a substrate on which a monomolecular nano-thin film is formed according to an example of the present disclosure.

A coating solution was prepared by adding 4-DMAP to a concentration of 0.5 wt % in water, ethanol, or isopropyl alcohol. Then, the coating solution was coated on a substrate using a Meyer rod and then annealed on a 100° C. hot plate for 1 minute to obtain a transparent monomolecular nano-thin film as shown in FIG. 2.

Example 4

Figure 3:
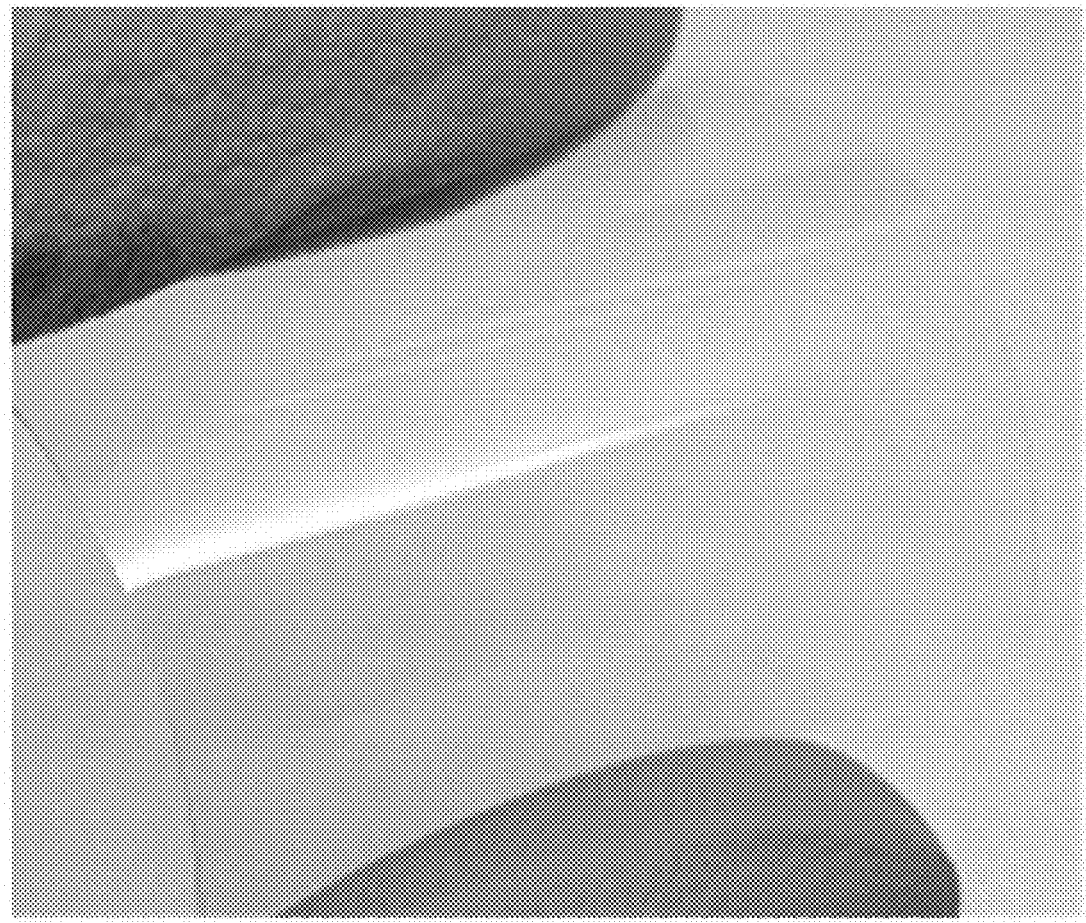
FIG. 3 is a photograph of a substrate on which a monomolecular nano-thin film is formed according to an example of the present disclosure.

A coating solution was prepared by adding 4-AP to a concentration of 0.5 wt % in water, ethanol, or isopropyl alcohol. Then, the coating solution was coated on a substrate using a Meyer rod and then annealed on a 100° C. hot plate for 1 minute to obtain a transparent monomolecular nano-thin film as shown in FIG. 3.

Example 5

A coating solution was prepared by adding 2-PA to a concentration of 0.5 wt % in water, ethanol, or isopropyl alcohol. Then, the coating solution was coated on a substrate using a Meyer rod and then annealed on a 135° C. hot plate for 1 minute.

Example 6

A coating solution was prepared by adding 4-DMAP to a concentration of 0.5 wt % in water, ethanol, or isopropyl alcohol. Then, the coating solution was coated on a substrate using a Meyer rod and then annealed on a 50° C. hot plate for 8 minutes.

Example 7

A PET substrate and a PEN substrate were prepared. Then, the two substrates were bonded to each other by performing thermocompression bonding at 130° C. and 10 MPa for 1 minute.

Example 8

The substrates coated with 4-AP and 2-PA monomolecular thin films prepared according to Example 4 and Example 5 were prepared on a PET substrate and a PEN substrate, respectively. Then, the surfaces coated with 4-AP and 2-PA were placed to face each other and thermocompression bonding was performed at 130° C. and 10 MPa for 1 minute to bond the two substrates to each other. During the bonding process, amine and a carboxylic acid functional group in the 2-PA monomolecular thin film and the 4-AP monomolecular thin film form an amide bond, and, thus, the substrates can be easily bonded to each other.

Figure 4:
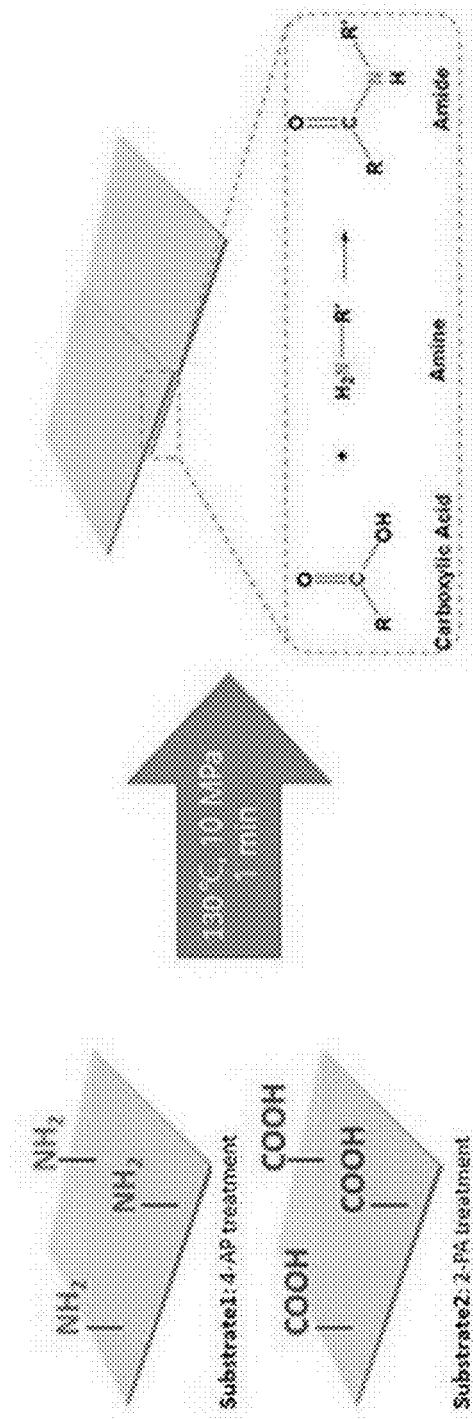
FIG. 4 is a schematic diagram showing a test process according to an example of the present disclosure.

FIG. 4 is a schematic diagram showing a test process according to an example of the present disclosure.

Comparative Example 1

To verify the effect of compounds, e.g., 4-DMAP and 4-AP, on the properties of a nano-thin film, which is the best feature of the present disclosure, a nano-thin film of Comparative Example 1 was prepared. The nano-thin film of Comparative Example 1 was prepared by the same method as in Example 1 except that the process of adding 4-DMAP to the silver nanowire dispersion solution and the process of annealing the coated thin film according to Example 1 were omitted.

Comparative Example 2

To verify the effect of compounds, e.g., 4-DMAP and 4-AP, on the properties of a nano-thin film, which is the best feature of the present disclosure, a nano-thin film of Comparative Example 2 was prepared. The nano-thin film of Comparative Example 2 was prepared by the same method as in Example 1 except that a commercial silver nanowire coating solution was used instead of the silver nanowire dispersion solution added with 4-DMAP of Example 1 and the process of annealing the coated thin film according to Example 1 was omitted.

Test Example 1

The properties of the nano-thin films prepared Example 1, Example 2, Comparative Example 1, and Comparative Example 2 were observed, and the result thereof was as shown in FIG. 5 to FIG. 13.

(a) and (b) of FIG. 5 are scanning electron microscopy images of nano-thin films prepared according to Example 1 and Example 2, respectively, of the present disclosure.

Referring to (a) and (b) of FIG. 5, it can be seen that the silver nanowire is embedded in the 4-DMAP thin film ((a) of FIG. 5) and the 4-AP thin film ((b) of FIG. 5).

(a) and (b) of FIG. 6 are scanning probe microscopy images of nano-thin films prepared according to Example 1 and Comparative Example 1, respectively, of the present disclosure.

Referring to (a) and (b) of FIG. 6, it can be seen that the nano-thin film of Example 1 ((a) of FIG. 6) has a flatter surface morphology than the nano-thin film of Comparative Example 1 ((b) of FIG. 6).

(a) of FIG. 7 and (b) of FIG. 7 show a transmittance-sheet resistance graph and a transmittance-haze graph of nano-thin films prepared according to Example 1 and Comparative Example 1, respectively, of the present disclosure.

Referring to (a) of FIG. 7 and (b) of FIG. 7, it can be seen that the addition of 4-DMAP does not have an effect on the transmittance and sheet resistance of the transparent electrode and the nano-thin film of Example 1 has a lower haze than the nano-thin film of Comparative Example at similar transmittance levels.

FIG. 8 is a graph showing the result of Scotch tape detachment test using nano-thin films respectively prepared according to Example 1, Example 2, Comparative Example 1, and Comparative Example 2 of the present disclosure.

Referring to FIG. 8, it can be seen that the nano-thin films of Example 1 and Example 2 maintain an initial resistance even after 100 times detachment test, whereas the nano-thin films of Comparative Example 1 and Comparative Example 2 sharply decrease in sheet resistance after several times test. (a) to (c) of FIG. 9 are scanning electron microscopy images and photographs of nano-thin films prepared according to Example 1, Comparative Example 1, and Comparative Example 2, respectively, of the present disclosure after Scotch tape detachment test.

Referring to (a) to (c) of FIG. 9, it can be seen that in the nano-thin film of Example 1, a silver nanowire network is maintained even after tape test, whereas in the nano-thin films of Comparative Example 1 and Comparative Example 2, a silver nanowire network is detached. This verifies that 4-DMAP enhances the adhesive force between the substrate and the silver nanowire.

(a) of FIG. 10 shows the result of Scotch tape detachment test of a nano-thin film prepared according to Example 1 of the present disclosure on various substrates, and (b) of FIG. 10 shows photographs of nano-thin films respectively prepared according to Example 1 and Comparative Example 1 of the present disclosure after Scotch tape detachment.

Referring to (a) and (b) of FIG. 10, it can be seen that the nano-thin film of Example 1 has excellent adhesive force with respect to various substrates such as PI, PEN, and glass substrates.

(a) to (d) of FIG. 11 are graphs showing the results of bending test and repeated bending test of nano-thin films respectively prepared according to Example 1, Comparative Example 1, and Comparative Example 2 of the present disclosure.

Referring to (a) to (d) of FIG. 11, it can be seen that the nano-thin film of Example 1 more stably maintains electrical conductivity during bending deformation than the nano-thin films of Comparative Example 1 and Comparative Example 2.

(a) of FIG. 12 is a resistance change graph of nano-thin films respectively prepared according to Example 1 and Comparative Example 1 of the present disclosure depending on exposure to air of 50° C., and (b) and (c) of FIG. 12 are scanning electron microscopy images of the nano-thin films prepared according to Example 1 and Comparative Example 1, respectively, of the present disclosure after 10 days of exposure to air of 50° C.

Referring to (a) to (c) of FIG. 12, it can be seen that the nano-thin film of Example 1 ((b) of FIG. 12) has a higher resistance to oxidation than the nano-thin film of Comparative Example 1 ((c) of FIG. 12).

FIG. 13 is a resistance change graph of nano-thin films respectively prepared according to Example 1 and Comparative Example 1 of the present disclosure after the nano-thin films are immersed in respective solvents and sonicated for 5 minutes.

Referring to FIG. 13, it can be seen that the nano-thin film of Example 1 has a higher resistance to various solvents than the nano-thin film of Comparative Example 1.

Test Example 2

FIG. 14 and FIG. 15 are wavelength-transmittance graphs of monomolecular nano-thin films respectively according to Example 3 of the present disclosure.

Referring to FIG. 14, it can be seen that the PET right after 4-DMAP is deposited thereon has a transmittance of from 40% to 50%, but as the annealing time of the PET deposited with 4-DMAP at 100° C. is closer to 1 minute, the transmittance increases.

Referring to FIG. 15, it can be seen that the PET deposited with 4-DMAP or the PET has a transmittance of up to 60% to ultraviolet light having a wavelength of less than 400 nm, but the PET annealed for 8 minutes and deposited with the 4-DMAP monomolecular thin film has a transmittance of from 70% to 90% to a wavelength of from 400 nm to 800 nm. In this case, the transmittance of the PET film itself is very similar to that of the PET deposited with the 4-DMAP monomolecular thin film. Therefore, the 4-DMAP monomolecular thin film can be considered as being highly transparent with transmittance close to 100%.

FIG. 16 and FIG. 17 show images of the surface of a monomolecular nano-thin film over annealing time in a method of preparing a monomolecular nano-thin film according to Example 3 of the present disclosure.

Referring to FIG. 14 to FIG. 17, the surface of the substrate right after the coating solution is coated has a high roughness and thus may have a very low transmittance. However, if annealing is performed at 100° C. for 1 minute or at 50° C. for 8 minutes, monomolecules in the coating solution form a thin film which can be an optically transparent film.

Test Example 3

FIG. 18 shows FT-IR graphs of monomolecular thin films coated on PET substrates according to Example 3 and Example 4, respectively, of the present disclosure.

Referring to FIG. 18, it can be seen that while 4-DMAP monomolecules or 4-AP are coated on the PET substrate and annealing is performed, a molecular structure of the 4-DMAP monomolecular thin film or 4-AP monomolecular thin film does not change. This means that while the monomolecular thin film is formed, polymerization of monomolecules or a change in molecular structure does not occur and the thin film formed after annealing is composed of monomolecules.

FIG. 19 shows FT-IR graphs of monomolecular thin films coated on Cu films according to Example 3 to Example 5, respectively, of the present disclosure.

Referring to FIG. 18 and FIG. 19, it can be seen that after 4-DMAP, 4-AP, or 2-PA monomolecular thin films are coated on the Cu substrates, a molecular structure of monomolecules is maintained. Referring to FIG. 18 and FIG. 19, it can be seen that a monomolecular thin film according to the present disclosure can be formed on a metal substrate as well as on a polymer substrate.

Test Example 4

FIG. 20 is an XRD graph of a monomolecular nano-thin film according to Example 3 of the present disclosure.

Referring to FIG. 20, it can be seen that a non-uniform monomolecular precipitate used for initial coating (4-DMAP before annealing) has crystallinity, but a monomolecular thin film formed after annealing (4-DMAP after annealing) does not have crystallinity. Therefore, it can be seen that the 4-DMAP monomolecular thin film has an amorphous crystalline structure.

Test Example 5

FIG. 21 shows AFM images of the surface morphology of bare PET and monomolecular thin films according to Example 3 to Example 5, respectively, of the present disclosure.

Referring to FIG. 21, it can be seen that the 4-DMAP, 4-AP, and 2-PA monomolecular nano-thin films have a very flat surface morphology.

FIG. 22 shows AFM images of steps of monomolecular thin films according to Example 3 to Example 5, respectively, of the present disclosure.

Referring to FIG. 22, it can be seen that the monomolecular nano-thin films have a thickness of from about 50 nm to about 80 nm.

Test Example 6

FIG. 23 is a wavelength-transmittance graph of a specimen according to Example 8 of the present disclosure.

Referring to FIG. 23, it can be seen that the transmittance of the PET/4-AP/2-PA/PET specimen prepared according to Example 8 is similar to that of a PET/PET specimen.

Therefore, it can be seen that the 4-AP and 2-PA monomolecular thin films have a very high transmittance.

FIG. 24 is a graph showing the adhesive strength of bonded polymer substrates respectively according to Example 7 and Example 8 of the present disclosure.

Referring to FIG. 24, the polymer substrates without a monomolecular thin film (Example 7) are not bonded to each other. However, it can be seen that the adhesive force between the polymer substrates coated with respective monomolecular thin films (Example 8) is greatly enhanced by chemical bonds between the monomolecular thin films. Therefore, the monomolecular thin films can be used as a transparent adhesive material.

The above description of the present disclosure is provided for the purpose of illustration, and it would be understood by those skilled in the art that various changes and modifications may be made without changing technical conception and essential features of the present disclosure. Thus, it is clear that the above-described examples are illustrative in all aspects and do not limit the present disclosure. For example, each component described to be of a single type can be implemented in a distributed manner. Likewise, components described to be distributed can be implemented in a combined manner.

The scope of the present disclosure is defined by the following claims rather than by the detailed description of the embodiment. It shall be understood that all modifications and embodiments conceived from the meaning and scope of the claims and their equivalents are included in the scope of the present disclosure.

What is claimed is:

1. A method of preparing a monomolecular nano-thin film, comprising:
   coating, on a surface of a substrate, a dispersion solution containing a compound represented by the following Chemical Formula 2; and
   forming the monomolecular nano-thin film on the surface of the substrate by annealing the coated substrate:

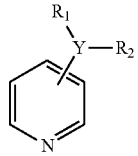

[Chemical Formula 2]

wherein in the above Chemical Formula 2,
   Y is nitrogen or carbon,
   $R_1$ and $R_2$ are each independently hydrogen, oxygen, a hydroxy group (—OH), or a linear or branched $C_1$ to $C_{10}$ alkyl group.

2. The method of preparing a monomolecular nano-thin film of claim 1,
   wherein the dispersion solution further contains a nanomaterial.

3. The method of preparing a monomolecular nano-thin film of claim 1,
   wherein the nanomaterial is embedded on the substrate by the compound represented by Chemical Formula 2.

4. The method of preparing a monomolecular nano-thin film of claim 2,
   wherein the nanomaterial includes a material having a shape selected from the group consisting of nanowire, nanoparticle, nanotube, nanofiber, nanorod, and combinations thereof.

5. The method of preparing a monomolecular nano-thin film of claim 2,
   wherein the nanomaterial contains a metal selected from the group consisting of Ag, Au, Pt, Al, Cu, Cr, V, Mg, Ti, Sn, Pb, Pd, W, Ni, and combinations thereof.

6. The method of preparing a monomolecular nano-thin film of claim 2,
   wherein the nanomaterial includes a silver (Ag) nanowire.

7. The method of preparing a monomolecular nano-thin film of claim 1, wherein the annealing is performed at from 20° C. to 350° C.

8. The method of preparing a monomolecular nano-thin film of claim 1, wherein the dispersion solution contains a solvent selected from the group consisting of isopropyl alcohol, water, ethylene glycol, diethylene glycol, polyethylene glycol, glycerol, propyl glycol, pentaerythritol, vinyl alcohol, polyvinyl alcohol, and combinations thereof.

9. The method of preparing a monomolecular nano-thin film of claim 1, wherein the substrate includes a substrate selected from the group consisting of a metal substrate, a plastic substrate, a glass substrate, a silicon substrate, a silicon oxide substrate, a Teflon film substrate, a sapphire substrate, a nitride substrate, and combinations thereof.

10. The method of preparing a monomolecular nano-thin film of claim 9, wherein the metal substrate contains a metal element selected from the group consisting of Cu, Al, Fe, Ni, Au, Pt, Ag, and combinations thereof.

11. The method of preparing a monomolecular nano-thin film of claim 9, wherein the plastic substrate includes a plastic substrate selected from the group consisting of polyethylene terephthalate (PET), poly(ether sulfone) (PES), polyethylene naphthalate (PEN), polycarbonate (PC), polystyrene (PS), polyimide (PI), polyethylene (PE), and combinations thereof.

12. The method of preparing a monomolecular nano-thin film of claim 1, wherein the coating is one selected from the group consisting of bar coating, spin coating, nozzle printing, spray coating, slot die coating, gravure printing, ink jet printing, screen printing, electrohydrodynamic jet printing, electrospray, and combinations thereof.

* * * * *